United States Patent [19]
Hoshiya et al.

[11] Patent Number: 5,843,589
[45] Date of Patent: Dec. 1, 1998

[54] MAGNETIC LAYERED MATERIAL, AND MAGNETIC SENSOR AND MAGNETIC STORAGE/READ SYSTEM BASED THEREON

[75] Inventors: Hiroyuki Hoshiya, Hitachi; Yoshihiro Hamakawa, Urawa; Susumu Soeya, Hitachi; Shigeru Tadokoro, Odawara, all of Japan

[73] Assignee: Hitachi, Ltd., Tokyo, Japan

[21] Appl. No.: 767,811

[22] Filed: Dec. 17, 1996

[30] Foreign Application Priority Data

Dec. 21, 1995 [JP] Japan .................................. 7-333015

[51] Int. Cl.⁶ ............................................... G11B 5/66
[52] U.S. Cl. ..................... 428/692; 428/611; 428/622; 428/627; 428/629; 428/632; 428/639; 428/641; 428/660; 428/667; 428/670; 428/678; 428/694 R; 428/694 TR; 428/694 T; 428/694 TS; 428/694 TM; 428/900; 360/113; 324/252
[58] Field of Search ..................... 428/611, 622, 428/627, 629, 632, 639, 641, 660, 667, 670, 678, 694 R, 694 TR, 692, 694 T, 694 TS, 694 TM, 900; 360/113; 324/252

[56] References Cited

U.S. PATENT DOCUMENTS

| | | | |
|---|---|---|---|
| 5,549,978 | 8/1996 | Iwasaki | 428/692 |
| 5,556,718 | 9/1996 | Motomura | 428/694 R |

FOREIGN PATENT DOCUMENTS

| | | |
|---|---|---|
| 2-61572 | 3/1990 | Japan . |
| 5-266436 | 10/1993 | Japan . |
| 6-60336 | 3/1994 | Japan . |
| 6-76247 | 3/1994 | Japan . |
| 6-111252 | 4/1994 | Japan . |

*Primary Examiner*—Leszek Kiliman
*Attorney, Agent, or Firm*—Fay, Sharpe, Beall, Fagan, Minnich & McKee

[57] ABSTRACT

A ferromagnetic and antiferromagnetic material having a high exchange coupling and a high thermal stability, and a magnetic storage system using this material which has excellent reliability and recording density, and a magnetoresistive storage/read separation head having a high sensitivity and a low noise property. The magnetic storage/read system of the invention mounts a magnetoresistive head using a chromium-manganese antiferromagnetic layer/a cobalt alloy layer as a pinning layer or the longitudinal bias layer of the spin-valve type magnetoresistive layered film.

31 Claims, 17 Drawing Sheets

CrMnPt 30nm, 250°C, 3hr

PINNING LAYER Co 1.5nm
PINNING LAYER NiFe 3nm
TB 320~330°C

* THICKNESS

SECTIONAL
TEM IMAGE
WITHOUT
HEAT
TREATMENT

SECTIONAL
TEM IMAGE
AFTER 250°C,
3hr

FFT IMAGE OF
CrMnPt PORTION
(WITHOUT HEAT
TREATMENT)

SUBSTANTIAL
SYMMETRY

FFT IMAGE OF
CrMnPt PORTION
(AFTER HEAT
TREATMENT)

ENLARGEMENT
OF SPOTS

THE PRODUCT OF THICKNESS AND SATURATION MAGNETIZATION IS A CONSTANT VALUE OF 3nm.T.

| CrMnPt 30* |
|---|
| Co-Ni |
| Cu 2.5 |
| NiFe 5 |
| Ta 5 |
| glass |

*THICKNESS

| $Cr_{48}Mn_{48}Pt_4$ 30* nm |
|---|
| $Co_{50}Ni_{20}Fe_{30}$ 2 nm |
| Cu 2.5 nm |
| $Co_{50}Ni_{20}Fe_{30}$ 5 nm |
| $Ni_{81}Fe_{19}$ 2 nm |
| Ta 5 nm |
| glass |

*THICKNESS

| Cr FASED OR Mn FASED ANTIFERROMAGNETIC MATERIAL |
|---|
| Co OR Co ALLOY FERROMAGNETIC MATERIAL |

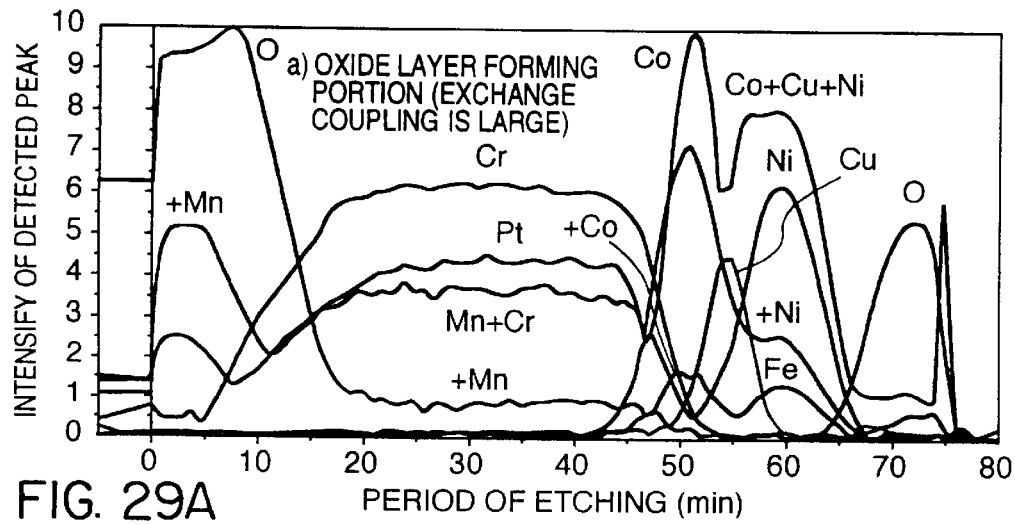
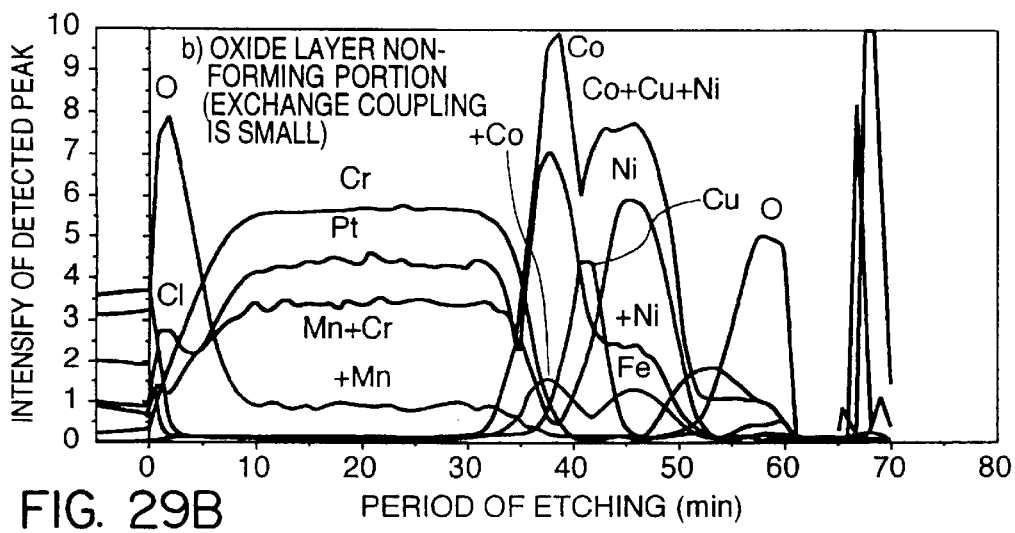

MAGNETIC LAYERED MATERIAL, AND MAGNETIC SENSOR AND MAGNETIC STORAGE/READ SYSTEM BASED THEREON

BACKGROUND OF THE INVENTION

1. Field of the Invention

The present invention relates to a magnetic layered material, a magnetic storage/read system and a magnetoresistive device, and particularly to a magnetic storage/read system having a high recording density.

2. Description of the Related Art

Japanese Unexamined Patent Publication No. 2-61572 discloses layered films in which electric resistance varies in accordance with an angle formed by magnetization directions of ferromagnetic layers separated by an intermediate layer, a magnetic field sensor and a magnetic storage system, as well as an iron-manganese alloy thin film.

Japanese Unexamined Patent Publication No. 6-60336 discloses means for achieving a vertical magnetization direction of a magnetic layer, or particularly, a magnetoresistance sensing system having a hard magnetic film, and describes a magnetoresistance sensor of which the magnetic layer comprises Co or a Co-based alloy.

Japanese Unexamined Patent Publication No. 6-76247 discloses a magnetic storage system using a nickel-manganese alloy thin film.

Exchange coupling of a chromium-manganese alloy film and a nickel-iron alloy film is reported in the digest of the 19th Annual Conference on Magnetics Japan (1995), pp. 352.

Japanese Unexamined Patent Publication No. 5-266436 discloses a magnetoresistive sensor in which a thin film material arranged in an interface between a non-magnetic layer and a ferromagnetic layer is separated by the non-magnetic layer.

Japanese Unexamined Patent Publication No. 6-111252 discloses a magnetoresistive sensor in which a soft magnetic intermediate layer is adhered between a ferromagnetic layer and an antiferromagnetic layer.

In the conventional art, it is difficult to achieve a magnetic storage system having a sufficiently high recording density, particularly a magnetoresistive device acting on an external magnetic field with a sufficiently high sensitivity and output in a reproduction part thereof, and it is further difficult to obtain satisfactory characteristics with a sufficiently inhibited noise, or to achieve functions as a storage system.

In order to improve the recording density, it is necessary to make narrower a unit of recording area on a recording medium, and this in turn requires downsizing of the reproducing part of a magnetic storage system. In this case, two problems are posed: first, for a small device, the shape anisotropy of a device end portion or the like cannot be disregarded, which may easily lead to a decrease in output; and secondly, a magnetic wall has an important effect, which may easily cause noise.

It is known at present that a multilayer formed by laminating ferromagnetic layers via a non-magnetic layer has a large magnetoresistance known as giant magnetoresistance. In such a multilayer the magnetoresistance brings about change of electric resistance in accordance with the variation of an angle made between the magnetizations of two ferromagnetic layers separated by the non-magnetic layer. When using this giant magnetoresistance in the form of a magnetoresistive device, a structure called a spin-valve is proposed. More particularly, this structure comprises an antiferromagnetic layer/a ferromagnetic layer/a non-magnetic layer/a ferromagnetic layer, substantially pinning (fixing) magnetization of the ferromagnetic layer in intimate contact with the antiferromagnetic layer by the action of an exchange coupling field produced on the interface thereof, and causing the magnetization of another ferromagnetic layer to be rotated under the effect of an external magnetic field. The effect of the foregoing pinning is herein referred to as pinning bias, and the layer producing this effect, as a pinning bias layer. For the purpose of obtaining a linear output to the external magnetic field, the direction of the pinning bias, i.e., the direction of the exchange coupling field of the antiferromagnetic layer is preferably in the direction of the field to be sensed. In the case of a magnetic head, this is generally in parallel with the MR height direction.

For restraining noise caused by domain wall migration of a magnetoresistive device, on the other hand, an effective way is to make a magnetoresistive layer become a single domain, and it is effective to apply a longitudinal bias to the magnetoresistive layer in a direction making a right angle to the direction of the magnetic field to be sensed. That is, in addition to the disappearance of the magnetic wall, it is thus possible to set the direction of magnetization so that the magnetization process is generated by magnetizing rotation. As means to apply the longitudinal bias, a method is known which comprise arranging a hard magnetic layer or a ferromagnetic layer to which an exchange coupling field is applied by an antiferromagnetic layer, in contact with an end of the magnetoresistive film in the track width direction, and using a static magnetic field leaking as a result of remanent magnetization. For a magnetic head, the direction of remanent magnetization or exchange coupling field is identical with the track width direction.

As described above, a magnetic head capable of coping with a high recording density is preferably configured, by use of giant magnetoresistance, so that the longitudinal bias for achieving a single domain is applied while using a spin-valve type magnetoresistive layered film. An antiferromagnetic layer is needed for any one or both of pinned bias and longitudinal bias of the layered film.

Publicly known antiferromagnetic layers are an iron-manganese alloy layer, and a nickel-manganese alloy layer, which, however, involve problems in material. The following five features are required for an antiferromagnetic layer material used in a magnetic storage/read system: (1) a large exchange coupling field; (2) properties are maintained even against temperature increase of over 100° C.; (3) properties can occur with a thin layer having a thickness of under 50 nm; (4) the magnetizing process does not require a complicated step such as, for example, a heat treatment for a long period of time; and (5) a sufficient resistance against environment to which the film is exposed. The foregoing known materials, when checked up with the above-mentioned requirements, still have problems in material as to temperature properties, corrosion resistance and simplification of process. These conventional materials have made it very difficult to achieve a magnetic storage/read system of a high recording density, and particularly, a reliability as a system.

As shown in the publicly known examples, however, an antiferromagnetic material excellent in corrosion resistance and temperature properties was found among Cr-Mn-based alloy thin films. A remaining problem is to obtain a large exchange coupling as described in (1) above. The reason is that, according to the known example, the exchange coupling field by a Cr—Mn-based alloy is about 20 Oe per 40 nm NiFe thin film at room temperature. If it is possible to increase this to about twice as high, it will make a large improvement of reliability of such an apparatus using this as, for example, a magnetic head of a magnetic storage/read system.

There is also a problem of thermal stability of a magnetoresistive film. Since the component elements of the foregoing spin-valve film are from about several nanometers to 10 nanometers in thickness, thermal stability is generally low. Improvement of thermal stability is effective for keeping high performance as a sensor or a medium and further for improving reliability.

SUMMARY OF THE INVENTION

The present invention has therefore an object to provide a magnetic storage system enabling high-density recording and a magnetoresistive device having sufficient output and improved low-noise property and reliability. More specifically, an object of the present invention is to provide a magnetic layered material having an antiferromagnetic layer displaying bias characteristics with simple structure and material, and a magnetic head and a magnetic storage/read system using such a magnetic layered material.

In accordance with a first feature of the present invention, there is provided a magnetic layered material comprising a ferromagnetic material and an antiferromagnetic material in intimate contact with the ferromagnetic material, wherein at least a part of the antiferromagnetic material causing the ferromagnetic material to have unidirectional anisotropy is made of a Cr-based alloy or an Mn-based alloy, and at least a part of said ferromagnetic material in intimate contact with the antiferromagnetic material is made of Co or a Co-based alloy.

In accordance with a second feature of the present invention, there is provided a magnetic sensor comprising a ferromagnetic material and an antiferromagnetic material in intimate contact with the said ferromagnetic material, wherein at least a part of the antiferromagnetic material causing the ferromagnetic material to have unidirectional anisotropy is made of a Cr-based alloy or an Mn-based alloy, and at least a part of the ferromagnetic material in intimate contact with the antiferromagnetic material is made of Co or Co-based alloy.

In accordance with a third feature of the present invention, there is provided a magnetic recording medium comprising a ferromagnetic material and an antiferromagnetic material in intimate contact with the ferromagnetic material, wherein at least a part of the antiferromagnetic material causing the ferromagnetic material to express unidirectional anisotropy is made of a Cr-based alloy or an Mn-based alloy, and at least part of ferromagnetic material in intimate contact with the antiferromagnetic material is made of Co or a Co-based alloy.

In accordance with a fourth feature of the present invention, there is provided a magnetic storage/read system comprising a disk which has a ferromagnetic recording medium for magnetically recording a signal and which has a magnetic head which performs a relative movement relative to the disk and which head has a surface sliding in the vicinity of the disk, so that a magnetic field leaking from said recording medium is detected, wherein the magnetic head has the above disclosed magnetic sensor.

In accordance with a fifth feature of the present invention, there is provided a magnetic storage/read system comprising a disk which has a ferromagnetic recording medium for magnetically recording a signal and a magnetic head which performs a relative movement relative to the disk and which head has a surface sliding in the vicinity of the disk, so that a magnetic head detects a magnetic field leaking from said recording medium, wherein said magnetic head has a thin film formed by sequentially laminating a soft magnetic layer, a non-magnetic layer, a ferromagnetic layer and an antiferromagnetic layer, in which magnetization of said soft magnetic layer rotates in response to an external magnetic field, resulting in a change in a relative angle to said ferromagnetic layer, thus bringing about magnetoresistance, and wherein the ferromagnetic layer is made of a layered material having a first ferromagnetic layer, a second ferromagnetic layer and a third ferromagnetic layer.

BRIEF DESCRIPTION OF THE DRAWINGS

FIG. 29 is a graph illustrating a composition analysis result measured by use of a micro-ohje method in a direction of depth of a spin valve film having a structure of CrMnPt/Co embodying the invention.

DESCRIPTION OF THE PREFERRED EMBODIMENTS

Figure 1:
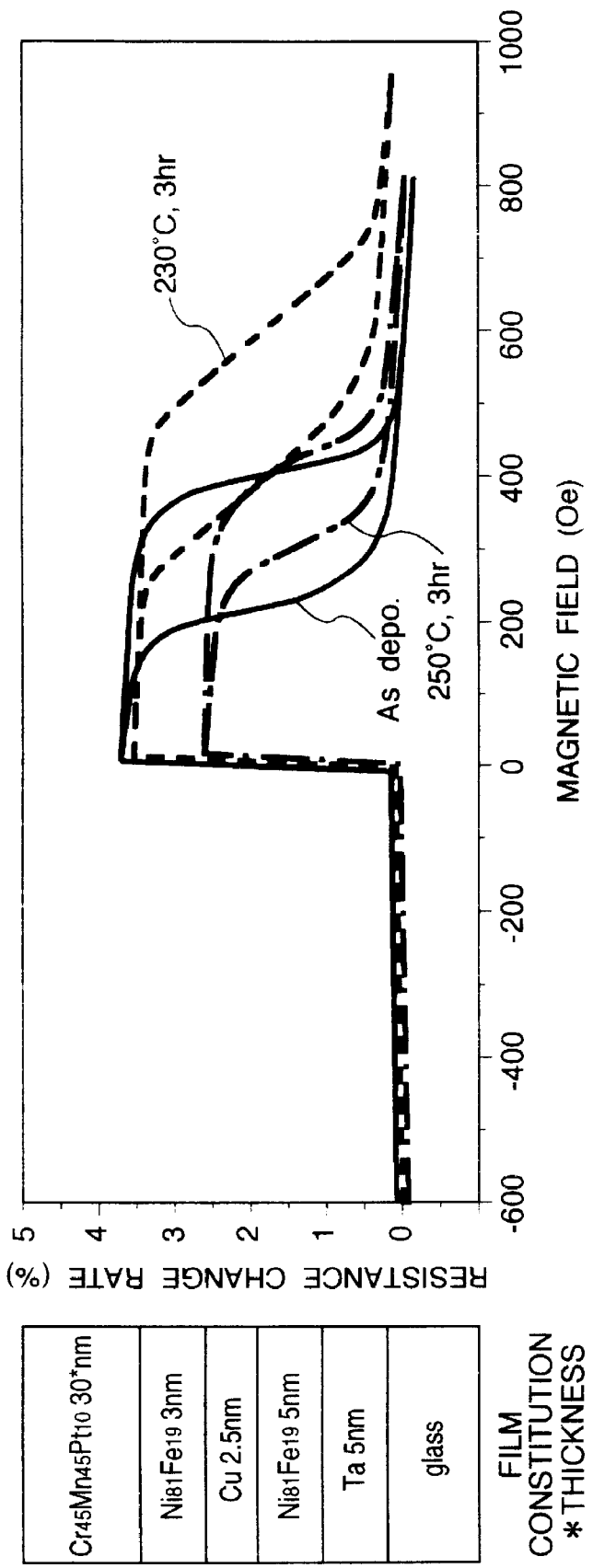
FIG. 1 is a graph illustrating properties of a spin-valve film using a chromium-manganese alloy layer/NiFe.

As means to achieve a high recording density, the present invention uses a magnetic storage system in which a magnetoresistive device is mounted on a magnetic head and which device uses giant magnetoresistance.

One of the subject matters to be solved is the development of an antiferromagnetic layer producing exchange coupling bias and which layer is in a direct contact with a ferromagnetic layer. As means to solve this subject, the first solution provided by the present invention is that the antiferromagnetic layer contains chromium and manganese as main constituents thereof. The second solution is to improve the magnitude of the exchange coupling field and temperature characteristic of the film by adding one or more selected from the group consisting of platinum group elements, gold, silver, copper, nickel and cobalt so that the lattice constant increases while keeping the structure having body centered cubic structure. The third solution is that the compositin of the ferromagnetic layer is made to be cobalt or a cobalt alloy mainly containing cobalt. The chemical composition of the cobalt alloy is preferably a Co—Fe—Ni alloy when used as a soft magnetic material, or a Co—Pt alloy when used as a high-coercivity material. The fourth solution is to perform a heat treatment to unify directions of unidirectional anisotropy. The fifth solution, which is effective particularly for a spin-valve type magnetoresistance film, is to form the ferromagnetic layer in contact with the antiferromagnetic layer so that the ferromagnetic layer is formed of a layered material having three or more ferromagnetic layers, and to prevent thermal deterioration of characteristics such as magnetoresistance and etc. by providing a total thickness of at least 3 nm regarding the ferromagnetic layer.

According to the present invention, in a magnetic storage/read system having a reproduction part comprising a magnetoresistive device, which has the material configuration and the magnetic properties as described above, it is possible to achieve recording at a high recording density, i.e., with a short recording wave length stored on the recording medium, and with a narrow recording track, to thereby obtain a sufficient reproduction output, thus permitting maintenance of a satisfactory record.

More specifically, the magnetic layered material, or particularly, the magnetoresistive device of the present invention achieves a pinning bias or a longitudinal bias by use of a combination of a magnetoresistive material of a chromium-based alloy or an Mn-based alloy and a ferromagnetic material of a cobalt alloy. Further, a spin-valve type magnetoresistive device having a high MR ratio, a large exchange coupling field and a high thermal stability can be achieved by use of a ferromagnetic layer in contact with the antiferromagnetic layer and which ferromagnetic layer is made of a layered material having three or more ferromagnetic layers such as, for example, Co/NiFeCr/Co, and which ferromagnetic layer also has a total thickness of at least 3 nm, or preferably, within a range of from 3 to 20 nm. It is thus possible to obtain a magnetoresistive device and a magnetic head excellent in both sensitivity and reliability, and a magnetic storage system having a high recording density.

The film constituting the magnetic layered material, the magnetic recording medium and the magnetoresistive device was prepared as follows by means of an RF magnetron sputtering apparatus. The following materials were sequentially laminated on a ceramic substrate having a thickness of 1 mm and a diameter of 3 inches in an argon atmosphere of 3 mTorr. Tantalum, a nickel—20 at. % iron alloy, copper cobalt and chromium—50 at. % manganese were employed as sputtering targets. In the preparation of a chromiummanganese alloy layer, 1-cm square chips of additive element were arranged on a chromium-manganese target, and the chemical composition was adjusted by increasing or decreasing the number of chips. As a ferromagnetic film, 1-cm square nickel-iron chips were arranged on a cobalt target when preparing a Co—Fe—Ni layer to adjust the chemical composition.

The layered film was formed by sequentially forming the individual layers by a method comprising the steps of previously generating plasma in the apparatus through application of a RF power to each of cathodes mounting a target, and opening and closing shutters arranged on the individual cathodes. Upon forming the film, by applying a magnetic field of about 30 Oe in parallel with the substrate with the use of a permanent magnet, uniaxial anisotropy was imparted and the direction of the exchange coupling field of the chromium-manganese layer was induced to the direction of the applied field. Examples of the conditions for producing the layers are shown in Table 1.

TABLE 1

| Layer | Ar gas pressure | rf power | speed of forming |
|---|---|---|---|
| Ta | 0.8 mTorr | 300 W | 0.25 nm/s |
| NiFe | 3 mTorr | 350 W | 0.17 nm/s |
| Cu | 3 mTorr | 150 W | 0.2 nm/s |

TABLE 1-continued

| Layer | Ar gas pressure | rf power | speed of forming |
|---|---|---|---|
| CrMnPt | 8 mTorr | 350 W | 0.5 nm/s |
| Co | 3 mTorr | 250 W | 0.13 nm/s |

The layered films were subjected to a heat treatment within a vacuum heat treatment device after the layered films had been formed. The heat treatment was performed by the steps of heating the layered films from a room temperature to a predetermined temperature (, for example, 250° C.), keeping them for a predetermined period of time (, for example, 1 hour), and cooling them. During all of the steps of the heating, keeping and cooling, a magnetic field of 2 to 5 KOe was applied to the layered films in a direction parallel to the face of a substrate. The direction of the magnetic field applied during the heat treatment was made to be parallel to the direction of the magnetic field applied by a permanent magnet when the layered films were formed.

Devices on the substrate were formed through patterning in a photo-resist process. Thereafter, the substrate was slider-processed and mounted on the magnetic storage system.

Examples of the present invention will now be described in detail with reference to the drawings.

FIG. 1 is a graph showing properties of a spin-valve film made of a magnetic layered material having a 45 at. % chromium—45 at. % manganese—10 at. % platinum antiferromagnetic layer/an 81 at. % Ni—19 at. % Fe layer, one of which properties relates to an as-deposited state and other properties are ones after heat treatments. A coupling field resulting from unidirectional anisotropy is represented by the amount of shift of the loop to the right in the graph. The coupling field has a field intensity of 300 Oe before a heat treatment and 380 Oe even after the heat treatment at 250° C. for three hours. When considering the thickness and the magnitude of magnetization of the NiFe layer, this is substantially on the same level as that shown in the conventional example.

Figure 2:
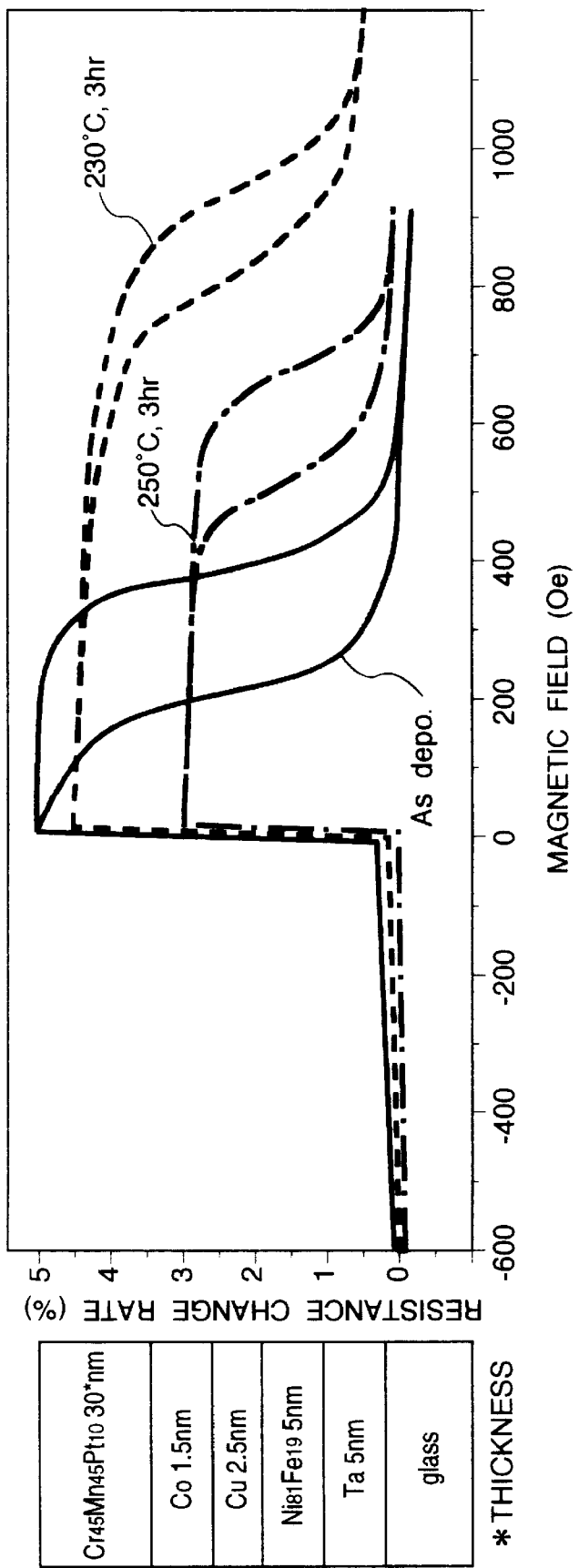
FIG. 2 is a graph illustrating properties of a spin-valve film using chromium-manganese alloy layer/ Co in the present invention before and after a heat treatment.

FIG. 2 shows properties of a spin-valve film made of a magnetic layered material having a 45 at. % chromium—45 at. % manganese—10 at. % platinum antiferromagnetic layer/Co layer, before and after heat treatments. The coupling field shows a field intensity of 300 Oe before a heat treatment, however, it is increased to 600 Oe which is about twice as much after the heat treatment at 250° C. for three hours. When considering the thickness and the magnitude of magnetization of the Co layer, this is about twice as large as that of the coupling field shown in FIG. 1.

Figure 3:
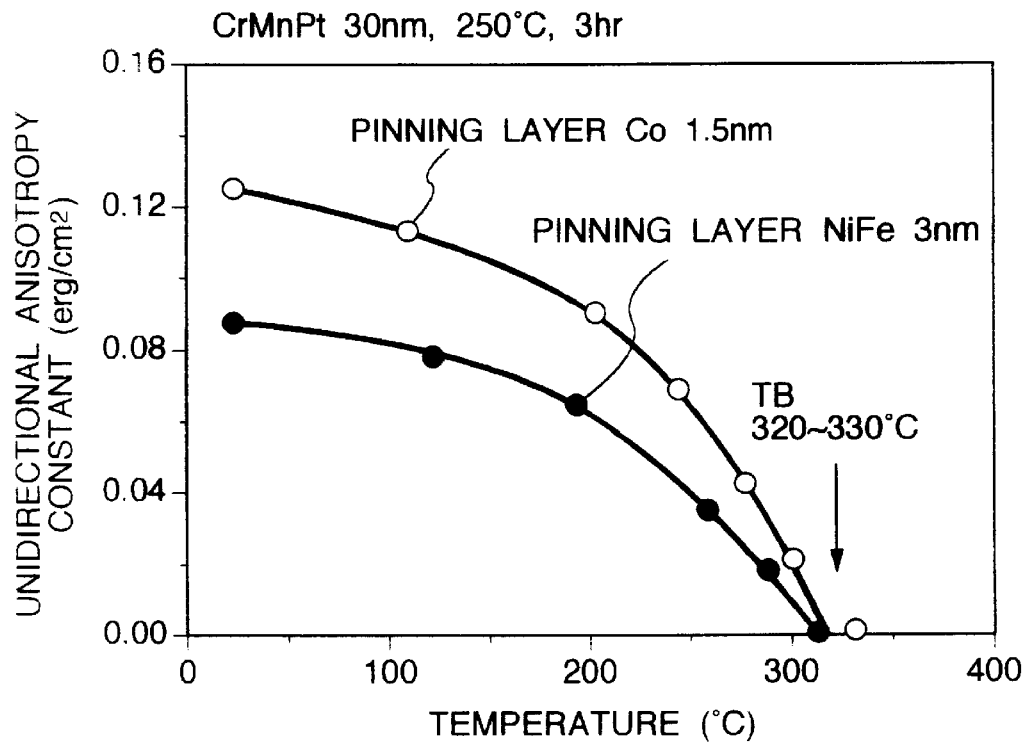
FIG. 3 is a graph comparing spin-valve films using chromium-manganese alloy layer/NiFe with a chromium-manganese alloy layer/Co in the present invention in terms of high-temperature stability.

FIG. 3 illustrates the results of a high-temperature measurement of anisotropy of samples heat-treated at 250° C. for three hours from among the magnetic layered material samples shown in FIGS. 1 and 2, which measurement was performed with a torque magnetometer. Any one of the measured samples does not lose anisotropy until temperature exceeds 300° C. The temperature at which anisotropy disappears is called the blocking temperature. These samples showed a blocking temperature within a range of from 320° to 330° C. Further, FIG. 3 suggests that the decrease in unidirectional anisotropic energy is only about 10% even at a temperature of 100° C. This is attributable to the fact that, when using the magnetic layered material of the present invention, the coupling field can be increased to about twice, and this magnitude is not lost even at an environmental temperature of 100° C. Actually at a temperature of 200° C., it becomes finally equal to the value at the room temperature available in a case where the composition of the present invention is not used.

Figure 4:
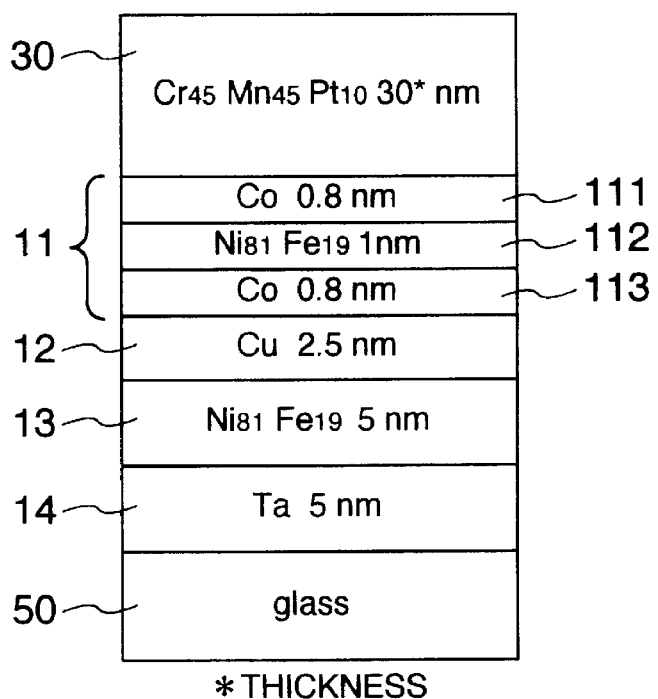
FIG. 4 is another embodiment of the present invention in the form of a spin-valve magnetoresistance film.

FIG. 4 illustrates another embodiment in which the magnetic layered material of the present invention is used in the form of a spin-valve magnetoresistive film. The ferromagnetic layer 11 in a close contact with an antiferromagnetic film 30 (45 at. % Cr—45 at. % Mn—10 at. % Pt) comprises a Co layer 111 in direct contact with the antiferromagnetic layer 30, a soft magnetic layer 112 having good magnetic properties (81 at. % Ni—19 at. % Fe), and a Co layer 113 in direct contact with a non-magnetic layer 12 (Cu) which Co layer produces giant magnetoresistance. A buffer layer 14 serves to control the crystal orientation and grain size of the other layers, and the soft magnetic layer 13 (81 at. % Ni—19 at. % Fe) is a free layer. More particularly, a Co layer is arranged at each of the contact surfaces with the antiferromagnetic layer and with the non-magnetic layer, however, this constitution does not deteriorate magnetic property of the ferromagnetic layer 11 which is a pinning layer, and without increasing the amount of magnetization of these layers as a whole. This constitution makes it possible to maintain the thickness and properties of the ferromagnetic layer 11. Thus, it is preferable that the soft magnetic layer 112 has a saturation flux density smaller than that of the layers 113 and 111 of Co. For example, the layer 112 is preferably made of $Ni_{81}Fe_{19}$ having a saturation flux density of 1 tesla. The saturation flux density may further be as low as about 0.5 tesla: an NiFe—Cr layer is proper for example. This NiFe—Cr layer is made of an NiFe alloy containing from 0 to 20% Cr, and the NiFe alloy consists essentially of from 75 to 95 at.% Ni and the balance Fe.

Figure 5:
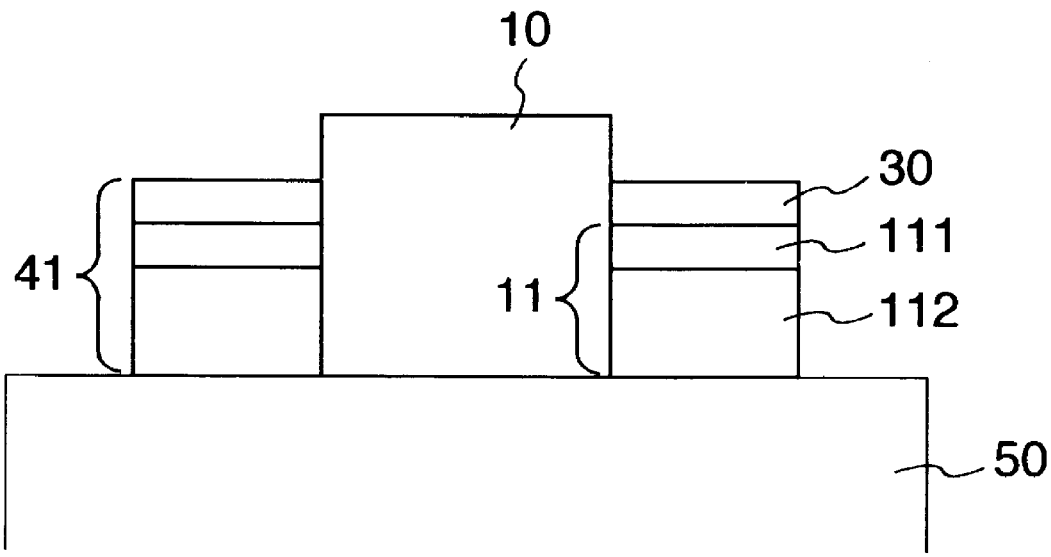
FIG. 5 illustrates an embodiment of the present invention in the form of a domain control film.

FIG. 5 illustrates an embodiment in which the magnetic layered material of the present invention is used as a domain control film. An antiferromagnetic film 30 (having the same chemical composition and contents as the film 30 in FIG. 4; hereafter a layer of the same reference numeral has the same chemical composition and contents) in close contact with a ferromagnetic layer 11 (having the same composition as the film 11 in FIG. 4) brings about unidirectional anisotropy. The ferromagnetic layer 11 comprises a Co layer 111 and a soft magnetic layer 112 (having the same chemical composition and contents as the layer 112 in FIG. 4). A domain control layer 41 adjacent to a magnetoresistance film 10 applies a magnetic field, which is generated from magnetization pinned by unidirectional anisotropy, to the magnetoresistive film 10 to impart a bias effect.

Figure 6:
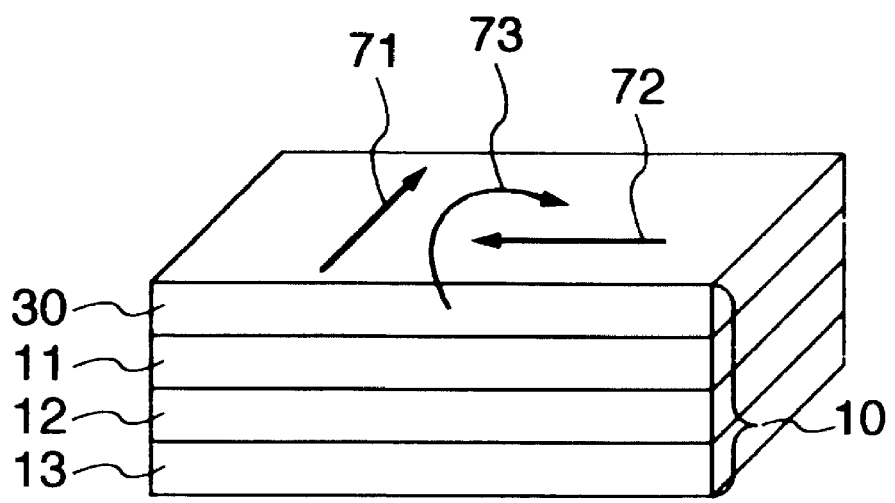
FIG. 6 illustrates an embodiment of the present invention in the form of a spin-valve type magnetoresistance device.

FIG. 6 illustrates an embodiment in which the magnetic layered material of the present invention is used for a spin-valve type magnetoresistive device 10. By setting the magnetizing direction 71 of unidirectional anisotropy and the current direction 72 so that the direction of a magnetic field 73 caused by current is the same as the magnetizing direction of unidirectional anisotropy 71, it becomes possible to increases the stability of the device.

Figure 7:
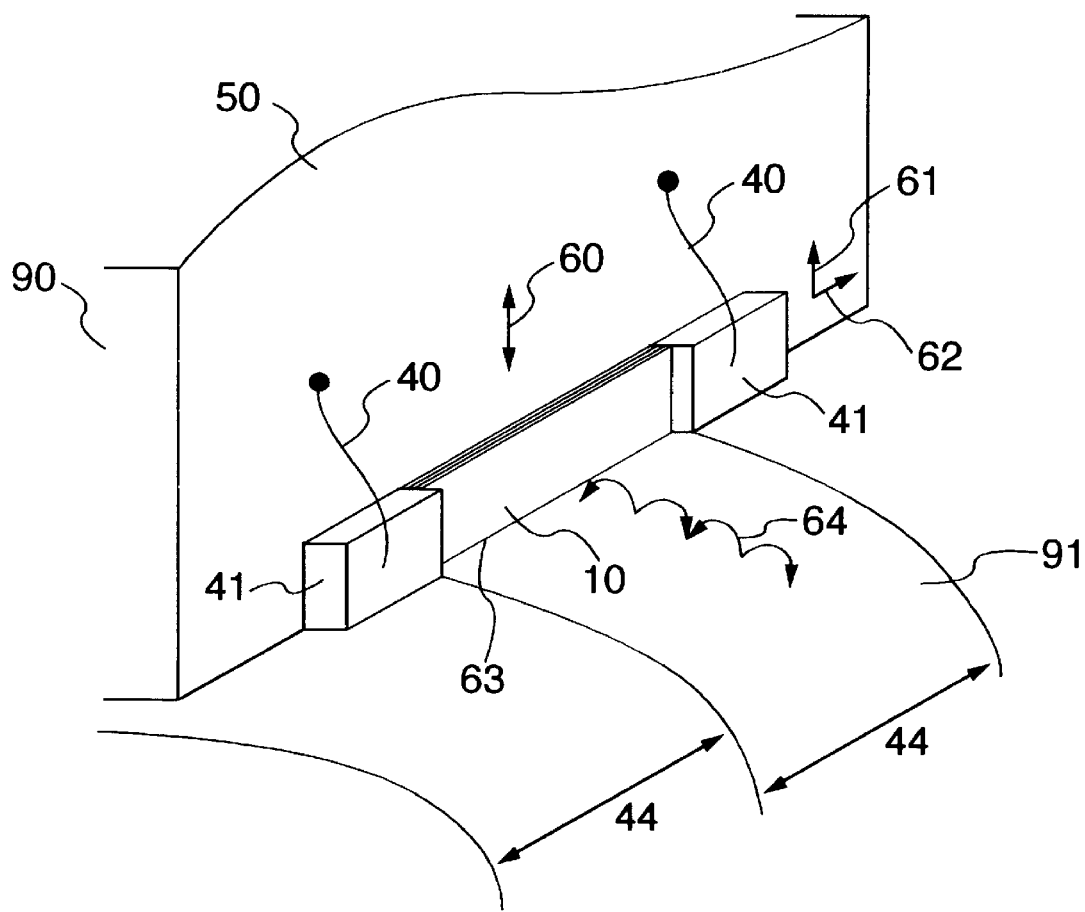
FIG. 7 is a conceptual diagram of a magnetic storage/read system using a magnetic head of the present invention.

FIG. 7 is a conceptual diagram of a magnetic storage/read system using the magnetic head of the present invention. A magnetoresistive film 10, a domain control film 41 and an electric terminal 40 are formed on a substrate 50 serving also as a head slider 90, and a magnetic head formed of these components is positioned at a recording track 44 on a disk 91 having a recording medium to conduct reproduction. The head slider 90 performs a relative drive on the disk 91 against a facing surface 63 at a height of up to 0.2 μm, or alternatively in contact therewith. Under the action of this mechanism, the magnetoresistive film 10 can be set at a position where a magnetic signal stored in the recording medium on the disk 91 can be read out from the leak magnetic field 64 from the recording medium.

The magnetoresistive film 10 may be formed by alternately laminating, for example, a plurality of magnetic layers and non-magnetic conductive layers, and a prinning bias layer such as an antiferromagnetic layer pinning magnetization of some magnetic layers. Electric resistance varies with fluctuation of a relative angle made between magnetization of some of the foregoing magnetic layers and magnetization of other layers rotating under the effect of an external field.

The foregoing external field is a component which is in a vertical direction regarding the facing surface 63 of the leaking field 64, i.e., this direction is the sensing direction 60 of the magnetic field to be sensed. A direction vertical with respect co the facing surface 63 is the direction of the device height, and the track width direction 62 is defined to be vertical regarding the device height direction 61 which direction 62 is at the same time in parallel with the facing surface 63.

The electric terminal 40 supplies current to this magnetoresistive film 10, and takes out electric resistance of the magnetoresistive film 10 varying with the external field in the form of an electric signal, particularly as voltage. The domain control film 41 imparts both an appropriate range of operation and domain control to the magnetoresistive film 10, which film 41 comprises a soft magnetic layer, or a soft magnetic film exchange-coupled with an antiferromagnetic film. The domain control film 41 is located at an end of the magnetoresistive film 10 in the track width direction 62.

Figure 8:
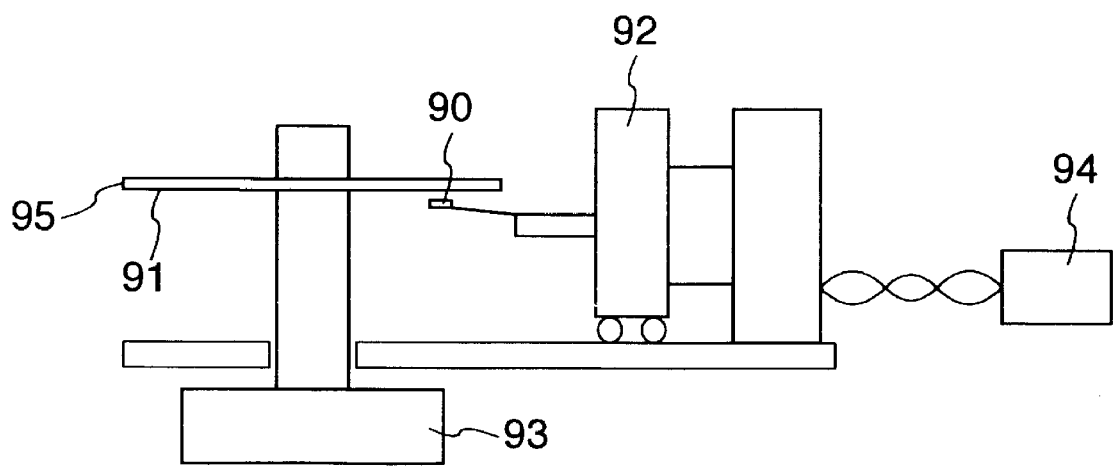
FIG. 8 shows an embodiment of the magnetic storage/read system of the present invention.

FIG. 8 is an embodiment of the magnetic storage/read system of the present invention. A disk 91 holding the recording medium magnetically recording information is rotated by a spindle motor 93, and the head slider 90 is guided onto the track of the disk 91 by the action of an actuator 92. In the magnetic disk apparatus, a reproducing head and a write head formed on the head slider 90 is relatively moved in the vicinity of a predetermined recording position by this mechanism to thereby sequentially write and read signals. A record signal is recorded onto the medium with the write head via a signal processing circuit 94, and an output of the reproducing head is made available through the signal processing circuit 94. Further, when moving the reproducing head onto a desired recording track, the position of the track is detected by means of a high-sensitivity output from this reproducing head, and the location of the head slider can be performed by controlling the actuator. In FIG. 8 a single head slider 90 and a single disk 91 are shown, however, these may be two or more. The disk 91 may have recording medium on both of the surfaces for recording information. When information is recorded on both the surfaces of the disk, a head slider 90 is provided for each of the surfaces.

The magnetic head and the magnetic storage/ read system having the magnetic head of the present invention having a construction as described above were tested. A low noise property was shown as a result, with satisfactory reliability of operations.

Figure 9:
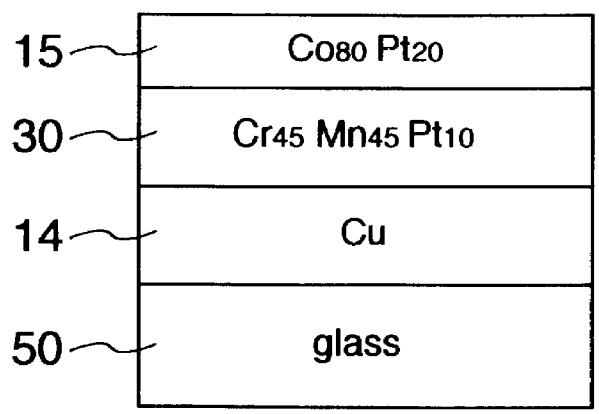
FIG. 9 shows an embodiment of the present invention in the form of a magnetic recording medium.

FIG. 9 illustrates an embodiment in which the present invention is applied to a magnetic recording medium. This comprises an antiferromagnetic layer 30 and a high-coercivity Co alloy layer 15 (80 at. % Co—20 at. % Pt) laminated onto a buffer film 14 of Cu. It is possible to reduce noise with this magnetic recording medium.

Figure 10:
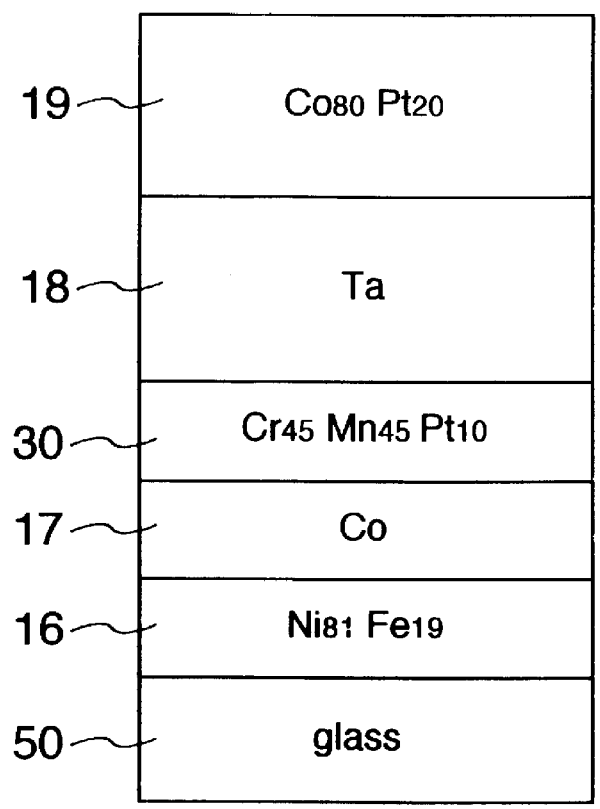
FIG. 10 shows another embodiment of the present invention in the form of a magnetic recording medium.

FIG. 10 illustrates another embodiment in which the present invention is applied to another magnetic recording medium. It comprises a soft magnetic layer 16 (81 at. % Ni—19 at. % Fe), an antiferromagnetic layer 30, a separating layer 18 (Ta), and a high-coercivity magnetic layer 19 (80 at. % Co—20 at. % Pt), all of which are laminated in this order on a glass 50. This can decrease noise caused by the soft magnetic film 16.

Figure 11:
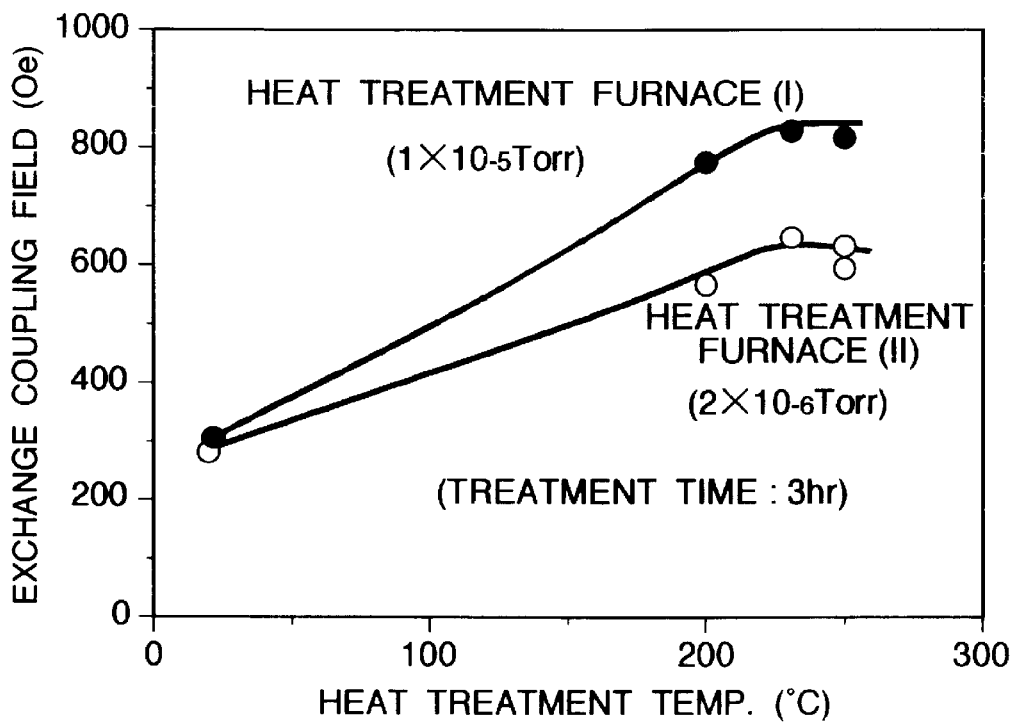
FIG. 11 is a graph illustrating the relationship between the heat treatment temperature and the exchange coupling field of the magnetic layered film of the present invention.

FIG. 11 shows a relation between the temperature of the heat treatment applied to a magnetic layered film in the present invention and an exchange coupling field. The exchange coupling field already rises at the heat treatment temperature of 200° C., and is substantially constant till 250° C. As disclosed in FIG. 3, a blocking temperature at which the exchange coupling field of the sample disappear is not less than 300° C., however, by heating up to this high temperature, the exchange coupling field is rather decreased although this is not disclosed in FIG. 11. This decrease is deemed to be caused by deterioration occurring due to the phenomenon that atoms in the interface are diffused by the excess of the heat treatment. Thus, it is found that, by performing the heat treatment and magnetism-applying steps at a temperature lower than the blocking temperature, the exchange coupling field can be kept rather large. Also, in FIG. 11 the results of heat treatments are disclosed which were performed by use of two kinds of heat treatment furnaces. According to the kinds of the heat treatment furnaces, the magnitude of the exchange coupling field varies greatly, which is deemed to occur due to the degree of vacuum and etc. This effect can be decreased or increased according to proper heat treatment conditions and proper selection of a protection layer.

Figure 12:
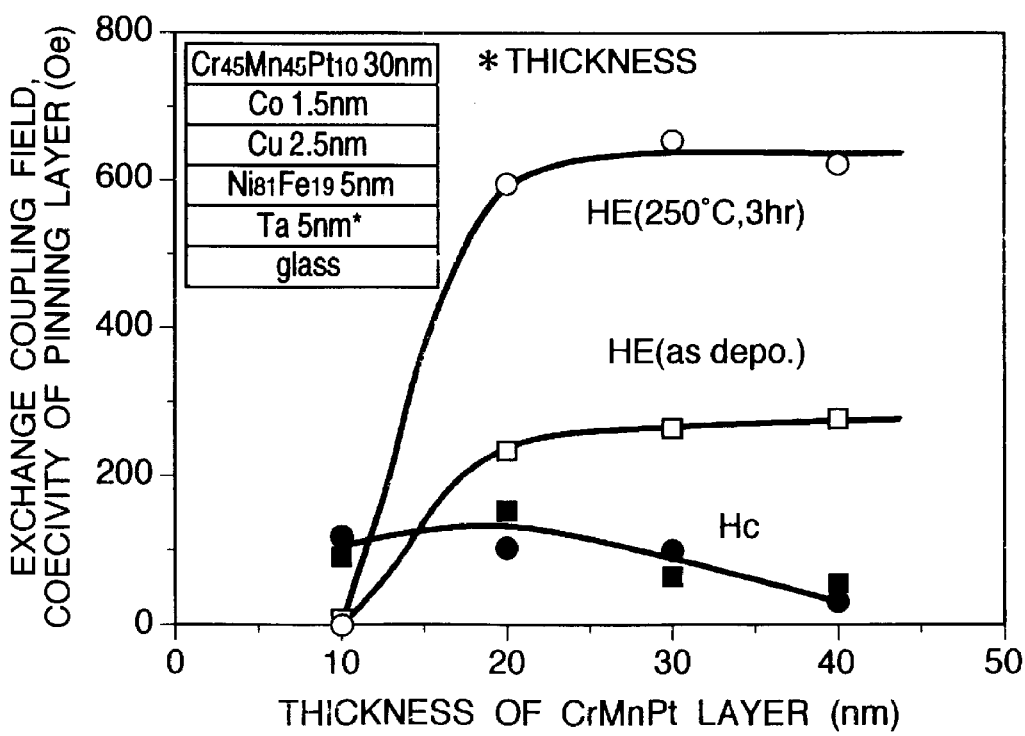
FIG. 12 is a graph illustrating a relation between CrMnPt layer thickness, exchange coupling field and coercive force.

FIG. 12 is a graph illustrating the thickness, exchange coupling field and coercive force of a CrMnPt layer based on the same magnetic layered material as that of the magnetic layered material shown in FIG. 2. Regarding samples not subjected to a heat treatment, there is observed no marked difference in exchange coupling field between thicknesses of the CrMnPt layer of 20 nm and 30 nm. However, when the CrMnPt layer has the thickness of 20 nm, the coercive force is larger in such a degree as it is closer to the value of the exchange coupling field corresponding to the 20 nm thickness, in comparison with that of 30 nm thickness. This property is not desirable. However, when attempting to increase the exchange coupling field by carrying out a proper heat treatment, as proposed in the present invention, there is almost no increase in coercive force. Even with a thickness of the CrMnPt layer of 20 nm, therefore, a satisfactory magnetic property is available. In the case of a magnetoresistive device, for example, it is possible to reduce the amount of current flowing in the antiferromagnetic layer,thus improving output as a sensor.

Figure 13:
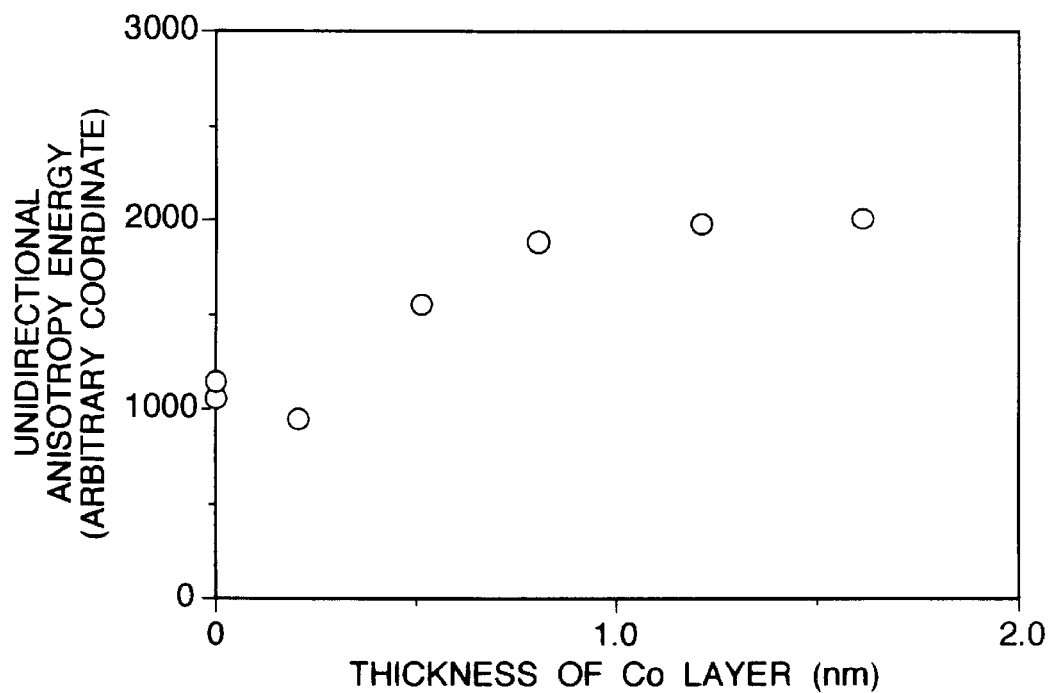
FIG. 13 is a graph illustrating the magnitude of exchange coupling varying with various thicknesses of a Co layer.

FIG. 13 is a graph illustrating a magnitude of the exchange coupling field for various thicknesses of the Co layer. At the thickness of the Co layer increases to become not less than 0.4 nm, the magnitude of the exchange coupling field represented by the product of the saturation magnetic flux density and thickness of the magnetic layer and the exchange coupling field, begins to increase, and is substantially saturated above 0.8 nm. Thickness of the Co layer adjacent to the antiferromagnetic film therefore preferably should be at least 0.4 nm, or more preferably, at least 0.8 nm.

Figure 14:
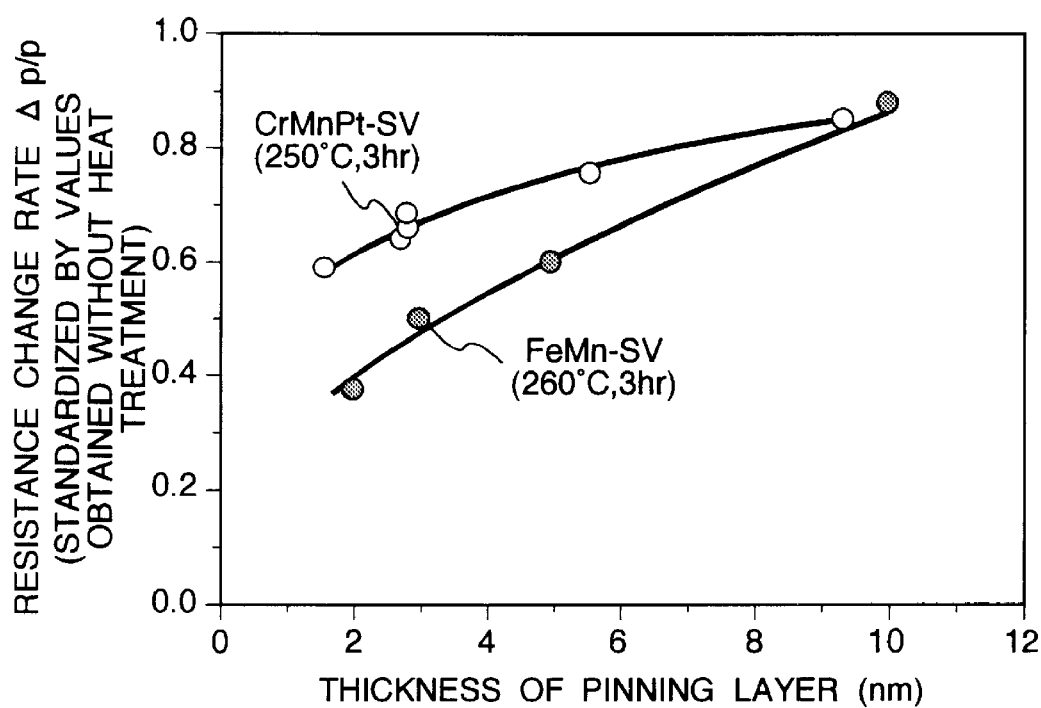
FIG. 14 is a graph illustrating thermal stability of a spin-valve film varying with various thicknesses of the pinning layer.

FIG. 14 is a graph illustrating thermal stability of a spin-valve film for various thicknesses of the pinning layer for the same magnetic layered material as that shown in FIG. 4. The MR ratio after heat treatment, as standardized with values obtained without a heat treatment is dependent upon the thickness of the pinning layer of the spin-valve film, i.e., the thickness of the ferromagnetic layer 11 as referred to in FIG. 4. A device can therefore be provided with better properties when increasing this thickness and preventing the amount of magnetization from increasing too much. An excessive increase in the amount of magnetization of this pinning layer unfavorably acts magnetostaticly on to soft magnetic layer 13 such as illustrated in FIG. 4. In the preferred embodiment of the present invention, satisfactory properties including an excellent thermal stability are available by use of the pinning layer having a three-layered structure of ferromagnetic material.

Figure 15:
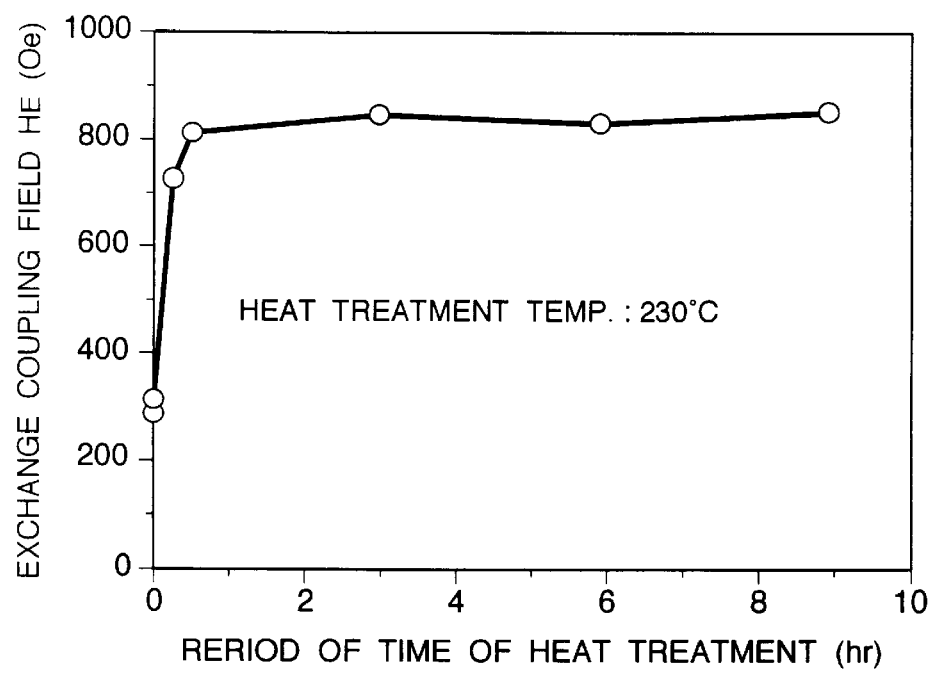
FIG. 15 is a graph illustrating the relationship between the heat treatment period of time and the exchange coupling field of the magnetic layered film of the present invention.

FIG. 15 is a graph illustrating a relationship between a heat treatment period of time and an exchange coupling field in the magnetic layered film of the present invention. The exchange coupling field increases already upon the lapse of 15 minutes of heat treatment, and becomes substantially constant till nine hours. This is a very short period of time as compared with the conventionally known order/disorder transformation of an Ni—Mn alloy.

Figure 16:
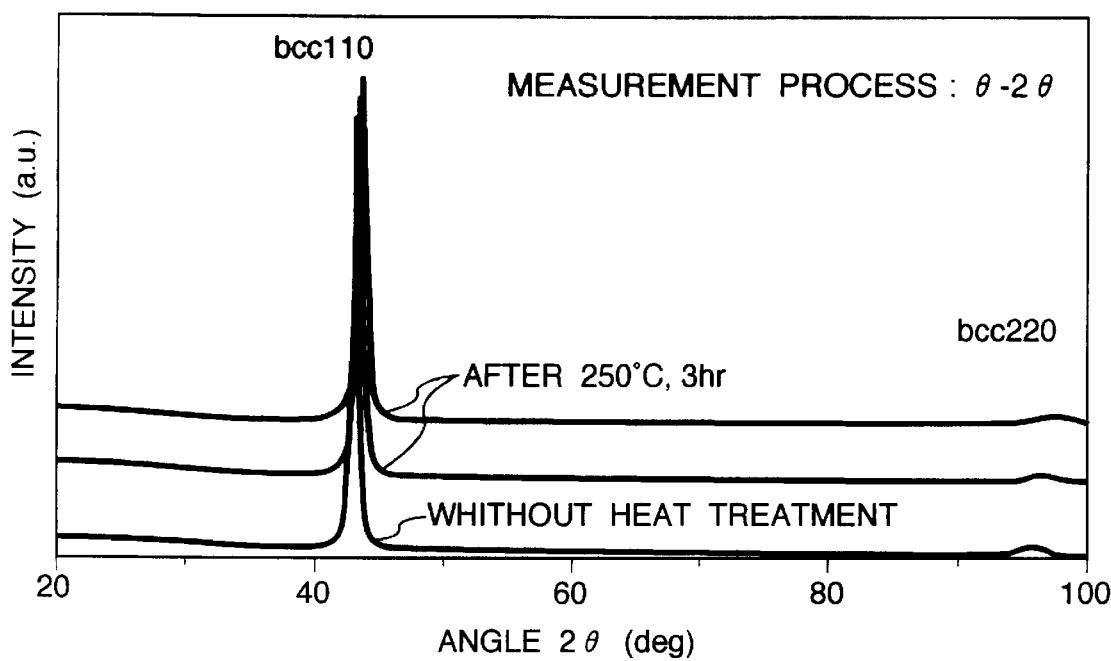
FIG. 16 is a graph illustrating X-ray diffraction curves before and after a heat treatment of the magnetic layered film of the present invention.

FIG. 16 is a graph illustrating X-ray diffraction curves before and after a heat treatment of the magnetic layered film of the present invention. The observed diffraction intensity is typically represented by reflection intensity values of 110 and 220, as expressed by an index determined on the assumption that the CrMnPt layer has a body-centered cubic structure (bcc), which discloses a satisfactory crystal orientation. A change in peak position is particularly noted. As compared with the case of no heat treatment, the diffraction peak after the heat treatment shifts toward a larger angle side. This suggests that the 110 face interval becomes smaller under the effect of the heat treatment.

Figure 17:
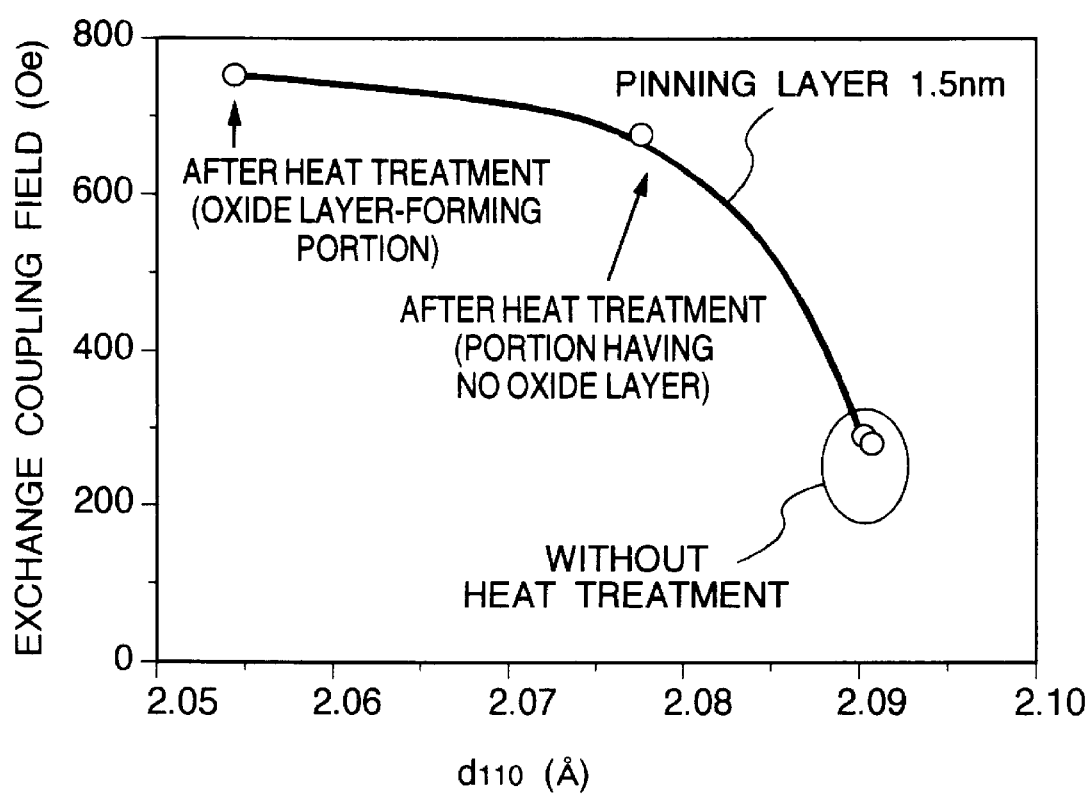
FIG. 17 is a graph illustrating the relationship between change in a 110 face interval and exchange coupling field as a result of a heat treatment of the magnetic layered film of the present invention.

FIG. 17 is a graph illustrating the relationship between the change in the 110 face interval caused by a heat treatment and the exchange coupling field with respect to the magnetic layered film of the present invention. The face interval is reduced by about 2% as compared with the case of no heat treatment, and there is a certain correlation between the reduction of the face interval and a magnitude of the exchange coupling field. That is, the strain in the crystals seems to increase the exchange coupling field. Further, even in a case where the same heat treatment is applied, there occurs such a case as the exchange coupling field and the decrease of the face interval are different, which phenomenon is caused by the aspect that the formation of oxide coating on the surface of CrMnPt layer is closely related to the increase of the exchange coupling field. This aspect is explained in connection with FIG. 29.

Figure 18A:
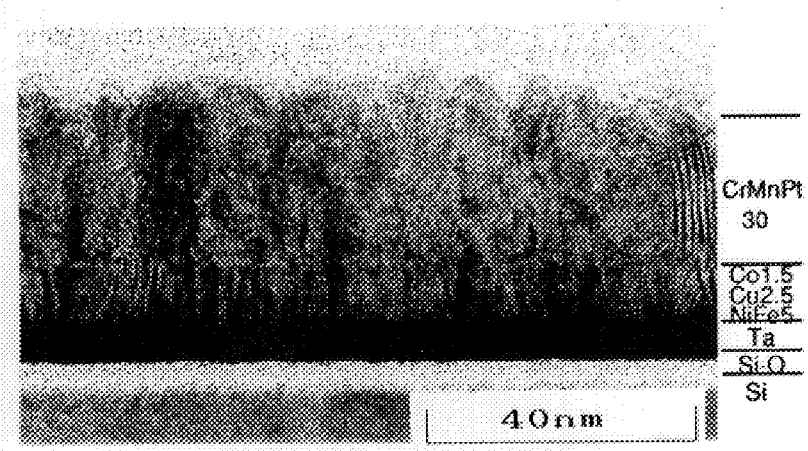
FIG. 18 illustrates sectional transmission electron microphotographs of the magnetic layered film of the present invention without heat treatment and after a heat treatment and sectional transmission electron microphotographs of high-speed Fourier conversion images (FTT images) of a CrMnPt layer portion.
Figure 18B:
Figures 18C, 18D:
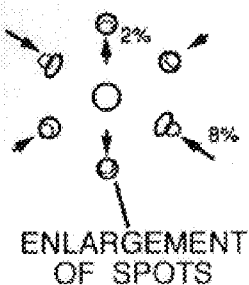

FIG. 18 shows sectional transmission electron microphotograph images and high-speed Fourier transformation images (FTT images) of the CrMnPt layer portion without and after a heat treatment of the magnetic layered film of the present invention. The sectional transmission electron microphotograph images suggest that there is no marked difference in the film structure between before and after the heat treatment. In the Fourier transformation images, on the other hand, the case without heat treatment shows a high symmetricity conforming to an ordinary body-centered cubic structure, whereas the image after the heat treatment has deflected spots. In a direction vertical as to the substrate surface, there is observed a reduction of about 2% similarly to the result shown in FIG. 17. In a direction oblique to this, spots become broader and are deflected by about 8%. Although details of deflection of the crystal lattice are not known, it is highly probable that the structure changes from the body-centered cubic structure, which had occurred before the heat treatment, into a deflected structure after the heat treatment. As described above, the increase in exchange coupling in the CrMnPt/Co layered structure is attributable to the respect that some change of the structure of the CrMnPt layer is induced by the heat treatment.

Figure 19:
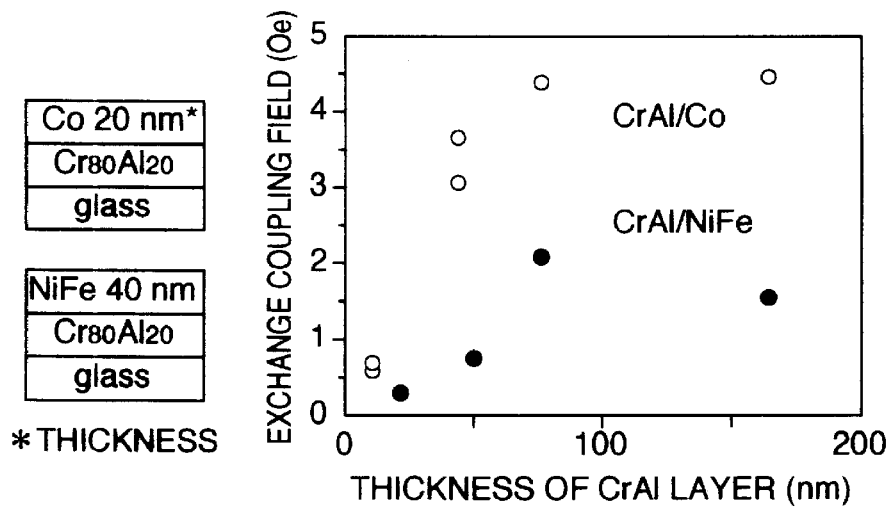
FIG. 19 is a graph illustrating exchange coupling fields of a CrAl antiferromagnetic layer/Co layer layered material and another CrAl antiferromagnetic layer/NiFe layer.

FIG. 19 is a graph showing the exchange coupling field of layered materials of CrAl antiferromagnetic layer/Co layer and CrAl antiferromagnetic layer/NiFe layer. Since the value of saturation magnetization is about twice in comparison with that of Ni81Fe19, the comparison is performed while the thickness of the Co layer is made to be half of the thickness of the NiFe layer. In FIG. 19, it is apparent that the exchange coupling field occurs when the thickness is not less than 50 nm and that the exchange coupling field in a case where the ferromagnetic layer is made of Co becomes larger than that in another case where the ferromagnetic layer is made of NiFe. In FIG. 19, the data are disclosed in the case where the Al content of the CrAl layer is 20 atomic %, however, similar results are obtained in a range of 5 to 30 atomic % Al regarding the composition of the CrAl layer.

Figure 20:
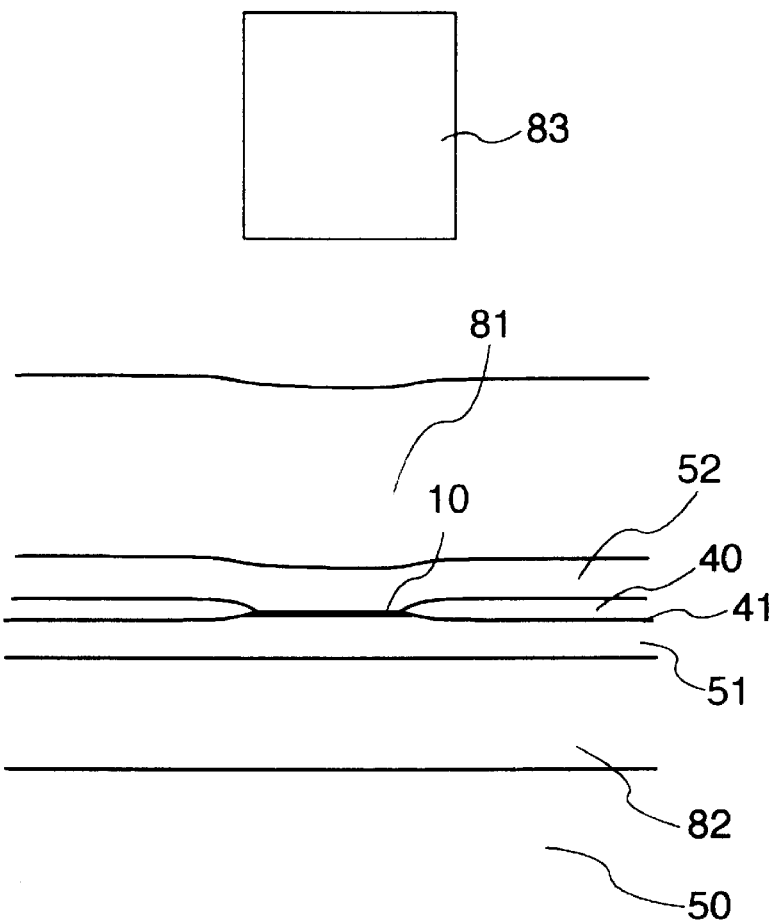
FIG. 20 shows an example of a constitution of a magnetic head viewed from the facing surface thereof opposing a disk.

FIG. 20 is a drawing showing an example of the constitution of a magnetic head embodying the invention when viewed from the facing surface opposing a disk. On and above a substrate 50, there are formed a lower shield 82, a lower gap 51, magnetoresistive laminated layers 10, magnetic domain-controlling layers, 41, electrode terminals 40, an upper gap 52, a lower magnetic core 81 also acting as an upper shield, and an upper magnetic core 83.

Figure 21:
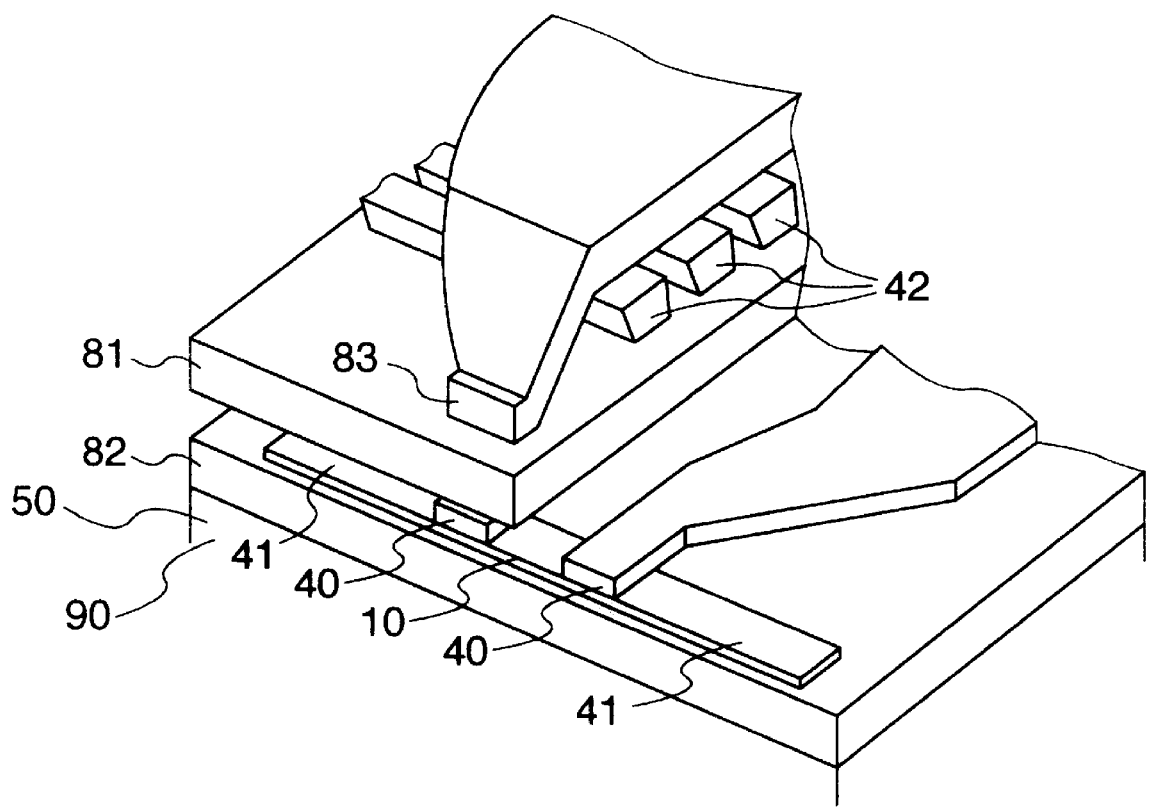
FIG. 21 is a schematic perspective view of a magnetic head of the present invention.

FIG. 21 is a conceptional perspective view of a magnetic head embodying the invention. In the magnetic head, on and above a substrate 50 also acting as a slider 90, there are formed a lower shield 82, a magnetoresistive layered film 10, magnetic domain-controlling films 41, electrode terminals 40, a lower magnetic core 81 also acting as an upper shield, and an upper magnetic core 83. In FIG. 21 a lower gap and an upper gap respectively corresponding to the lower gap 51 and the upper gap 52 disclosed in corresponding to the lower gap 51 and the upper gap 52 disclosed in FIG. 20 are omitted. A coil 42 generates magnetomotive force in the upper magnetic core and the lower core (also acting as the upper shield) because of electromagnetic induction effect.

Figures 22, 24, 25:
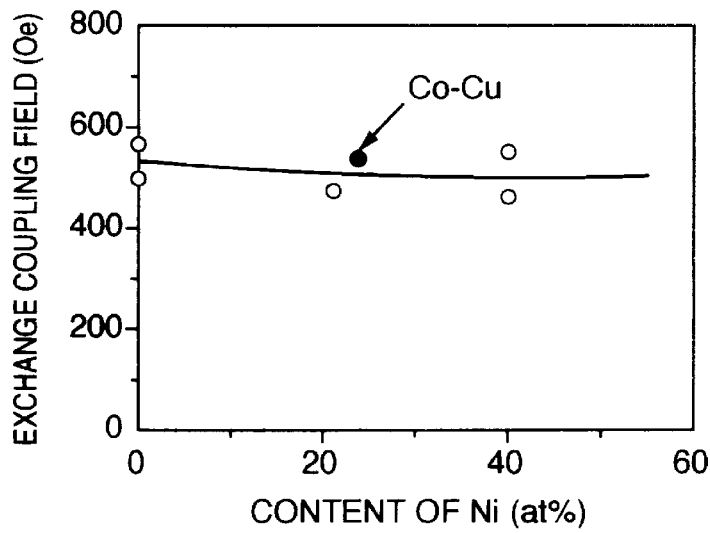
FIG. 22 is a graph illustrating exchange coupling field in a case of using Co—Ni pinning layer and Co—Cu pinning layer.
FIG. 24 shows an example of a spin valve film using $Co_{50}Ni_{20}Fe_{30}$ alloy layer as a pinning layer and a free layer.
FIG. 25 shows an example of a magnetic layered material of the present invention.

FIG. 22 is graph showing exchange coupling field in a case where Co—Ni and Co—Cu alloy pinning layers are used. The thickness of the Co—Ni and Co—Cu alloy layers are set so that the product of the saturation magnetization and the thickness becomes 3 nm ·T. By adding Ni in the layer, the saturation magnetization is lowered.

The saturation magnetization decreases down to 1.2 T in a case of 40 at. % Ni, however, the exchange coupling field is kept to be substantially constant as shown in FIG. 22, so that it is found that the replacement of Co layer by use of Co—Ni layer brings about the same effect. Even by adding Cu in the Co layer, the saturation magnetization also decreases, which saturation magnetization decreases down to 1.2 T in a case of 20 at. % Cu. However, an exchange coupling field similar to that of the Co layer is obtained even when the Co layer is replaced by Co—Cu layer as shown in FIG. 22.

Figure 23:
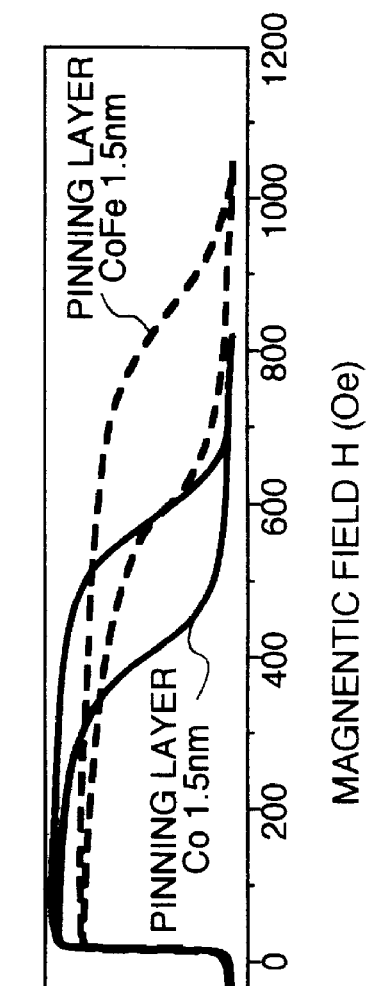
FIG. 23 is a graph illustrating magnetic resistance curves of a spin valve film having structures of $Mn_{78}Ir_{22}$ antiferromagnetic layer/Co and $Mn_{78}Ir_{22}$ antiferromagnetic layer/$Co_{90}Fe_{10}$.

FIG. 23 is a graph showing magnetoresistance curves of spin valves having the structures of $Mn_{78}Tr_{22}$ antiferromagnetic layer/Co and $Mn_{78}Tr_{22}$ antiferromagnetic layer/$Co_{90}Fe_{10}$, the exchange coupling field thereof being respectively 500 oersted and 700 oersted, from which it is found that it becomes possible to a obtain layer exchange coupling field. These favorable characteristics are obtained regarding Ir content of 10 to 40 at. % and preferably 15 to 25 at. %.

FIG. 24 shows an example of the constitution of a spin valve in which a $Co_{50}Ni_{20}Fe_{30}$ alloy layer is used as a part of the spinning layer and a free layer. The CoNiFe alloy layer is excellent in soft magnetism characteristic, has large giant magnetoresistive effect in comparison with a Co layer, and makes it possible to a obtain good exchange coupling field when it is laminated with an antiferromagnetic layer. Thus, by using the constitution shown in FIG. 24, it becomes possible to obtain such a magnetoresistive layered film as having superior soft magnetic property and large magnetoresistance, and as the production is readily performed because the kinds of laminated layers are few, and to obtain a magnetic sensor using this magnetoresistive layered film.

FIG. 25 shows an example of the constitution of a magnetic layered material embodying the present invention, which material is formed by laminating a Cr-based or Mn-based antiferromagnetic layer (particularly an antiferromagnetic thin layer) and a ferromagnetic layer (particularly a ferromagnetic thin layer) made of Co or Co alloy. In an interface defined between these layers, unidirectional anisotropy is induced because of exchange coupling effect. Thus, when observing a magnetization process while externally applying a magnetic field, it was observed as if a certain magnetic field exists in a certain direction in addition to the external magnetic field. This magnetic field is called an "exchange coupling field". The magnetic layered material of the present invention has the structure of FIG. 25 as a basic unit constitution, which constitution or another constitution having another laminated structure is applied.

Figure 26:
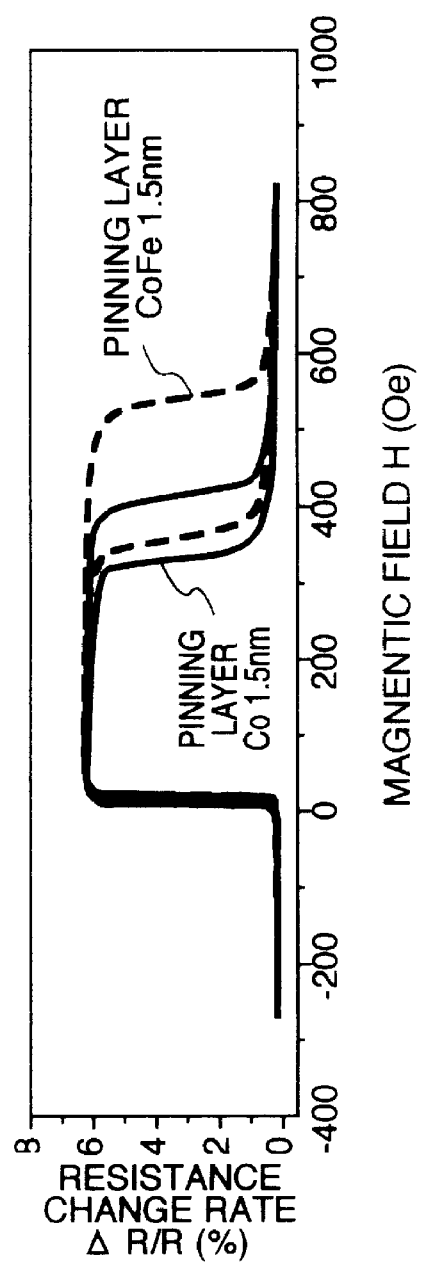
FIG. 26 is a graph illustrating magnetic resistance curves of spin valve films having structures of CrMnPt/Co and CrMnPtCo$_{90}$Fe$_{10}$.

FIG. 26 is a graph showing the magnetoresistance curves of spin valve films having constitution of CrMnPt/Co and CrMnPt/$Co_{90}Fe_{10}$, the exchange coupling fields of which are 400 oersted and 470 oersted, respectively. Thus, it is found that a large exchange coupling can be obtained in this case. These good characteristics are obtained in the Fe content of 0 to 30 at. %, and even in a case where Ni of up to about 30 at. % is added thereto, the same effect can be obtained.

Figure 27:
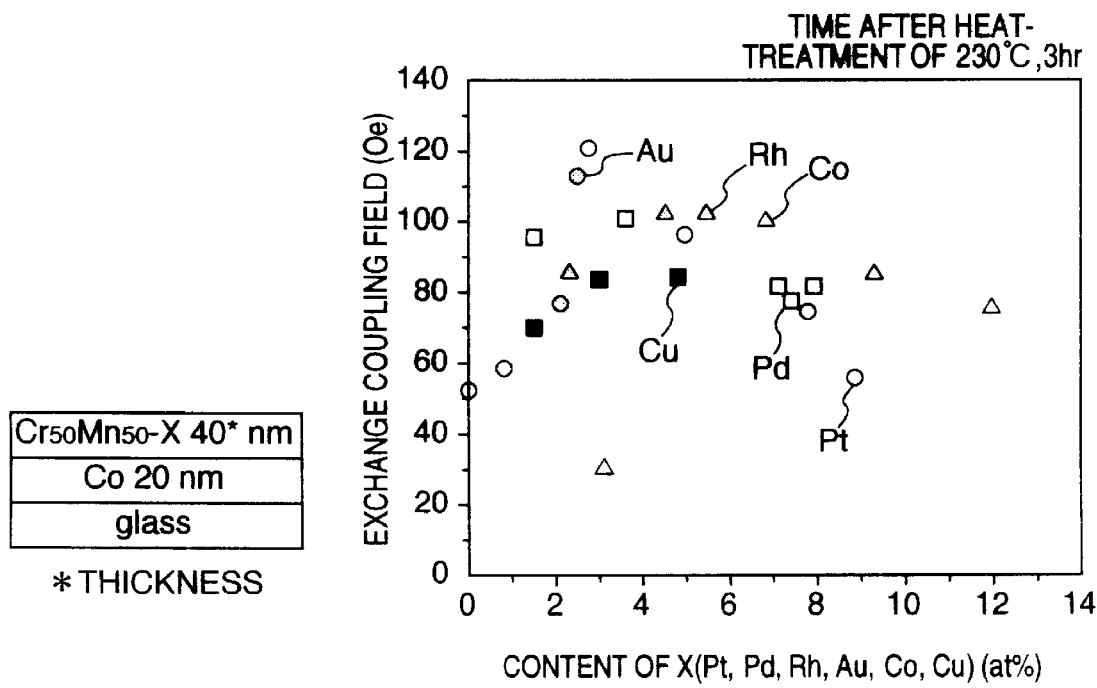
FIG. 27 is a graph illustrating exchange coupling field of magnetic layered materials having a structure of CrMn—X (X=Pt, Pd, Rh, Au, Co, Cu)/Co embodying the present invention.

FIG. 27 is a graph showing an exchange coupling field of a magnetic layered material embodying the invention which has the constitution of CrMn—X (X=Pt, Pd, Rh, Au, Co, Cu)/Co, from which drawing it is found that, by adding any one of the additive elements (Pt, Pd, Rh, Au, Co, and Cu) the content of which any one is up to about 15 at. %, the exchange coupling field can be enhanced. Further, even in a case of increasing the additive amount up to about 30 at %, the exchange coupling field can be obtained. The addition of a plurality of additive elements brings about the same effect.

Figure 28:
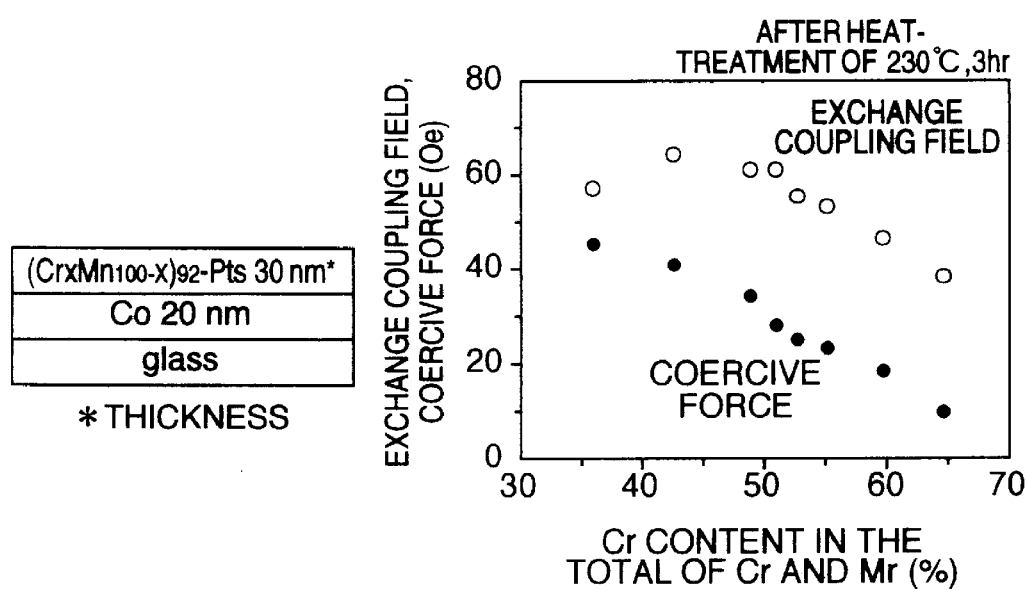
FIG. 28 is a graph showing composition dependence of exchange coupling field and coercive force regarding $(Cr_xMn_{100-x})_{92}$-$Pt_8$/Co film.

FIG. 28 is a graph showing the aspect that the exchange coupling field and coercive force depend on the composition of the $(Cr_xMn_{100-x})_{92}$-$Pt_8$/Co film embodying the present invention. In this case, even when the content ratio of Cr to Mn is changed from 30 to 70%, a sufficiently large exchange coupling field can be obtained, and particularly when the Cr/Mn ratio ranges from 50 to 30%, a larger exchange coupling field can be obtained. Further, when the Cr/Mn ratio ranges from 50 to 70%, both the smaller coercive force and improved corrosion resistance can be obtained.

FIG. 29 is a graph showing the results of the composition analysis of a spin valve having a CrMnPt/Co structure embodying the present invention. The analysis is performed in the direction of the depth thereof by use of a process, from which results it is found that a oxide layer is formed on the surface of the layer. A magnetic layered material obtained by heat-treating this Mn-rich oxide layer has a remarkably enhanced exchange coupling field. In this embodiment the oxide layer is formed by the heat treatment, however, a layer equivalent thereto can be formed by use of other treatments such as thin film-forming technique, ion implantation and etc.

According to the present invention, as described above in detail, it is possible to obtain a magnetic layered material having a sufficient coupling field and a high temperature stability, and hence to obtain a magnetic sensor having a sufficient reproducing output and low noise properties and a high-density storage/read system having a high reliability.

What is claimed is:

1. A magnetic layered material comprising a ferromagnetic material and an antiferromagnetic material in intimate contact with said ferromagnetic material, at least a part of said antiferromagnetic material acting to bring about unidirectional anisotropy in the ferromagnetic material being made of Cr—Mn-based alloy, and at least a part of said ferromagnetic material in intimate contact with said antiferromagnetic material being made of Co or Co-based alloy.

2. A magnetic sensor comprising a ferromagnetic material and an antiferromagnetic material in intimate contact with said ferromagnetic material, at least a part of said antiferromagnetic material acting to bring about unidirectional anisotropy in the ferromagnetic material being made of Cr—Mn-based alloy, and at least a part of said ferromagnetic material in intimate contact with said antiferromagnetic material being made of Co or Co-based alloy.

3. A magnetic recording medium comprising ferromagnetic material and an antiferromagnetic material in intimate contact with said ferromagnetic material, at least a part of said antiferromagnetic material acting to bring about unidirectional anisotropy in the ferromagnetic material being made of Cr—Mn-based alloy, and at least a part of said ferromagnetic material in intimate contact with said antiferromagnetic material being made of Co or Co-based alloy.

4. A magnetic layered material according to claim 1, wherein said Cr—Mn-based alloy is a Cr—Mn alloy containing from 30 to 70 atomic % Mn.

5. A magnetic sensor according to claim 2, wherein said Cr—Mn-based alloy is a Cr—Mn alloy containing from 30 to 70 atomic % Mn.

6. A magnetic recording medium according to claim 3, wherein said Cr—Mn-based alloy is a Cr—Mn alloy containing from 30 to 70 atomic % Mn.

7. A magnetic layered material according to claim 4, wherein said Cr—Mn-based alloy further contains at least one selected from the group consisting of Co, Ni, Cu, Ag, Au, Pt, Pd, Rh, Ru, Ir, Os and Re in an amount from 0.1 to 30 atomic % in total.

8. A magnetic sensor according to claim 5, wherein said Cr—Mn-based alloy further contains at least one selected from the group consisting of Co, Ni, Cu, Ag, Au, Pt, Pd, Rh, Ru, Ir, Os and Re in an amount of from 0.1 to 30 atomic % in total.

9. A magnetic recording medium according to claim 6, wherein said Cr—Mn-based alloy further contains at least one selected from the group consisting of Co, Ni, Cu, Ag, Au, Pt, Pd, Rh, Ru, Ir, Os and Re in an amount of 0.1 to 30 atomic % in total.

10. A magnetic storage/read system comprising a disk which has a ferromagnetic recording medium magnetically recording a signal and which has a magnetic head performing relative movement relative to said disk, which head has a surface sliding in the vicinity of of disk, so that a magnetic field leaking from said recording medium is detected, wherein said magnetic head has a magnetic sensor according to claim 2.

11. A magnetic storage/read system according to claim 10, wherein said magnetic sensor has a structure of a soft magnetic layer/a non-magnetic layer/a ferromagnetic layer/ an antiferromagnetic layer, and in which structure magnetization of said soft magnetic layer rotates in response to an external magnetic field, resulting in a change in a relative angle defined by both the rotated magnetization and that of said ferromagnetic layer, thus imparting magnetoresistance.

12. A magnetic storage/read system according to claim 11, wherein said ferromagnetic layer is made of Co or Co-based alloy, said antiferromagnetic layer being made of Cr—Mn-based alloy or Cr—Mn-based alloy containing at least one selected from the group consisting of Co, Ni, Cu, Ag, Au, Pt, Pd, Rh, Ru, Ir, Os and Re in a total content of from 0.1 to 30 atomic %.

13. A magnetic storage/read system according to claim 11, wherein said ferromagnetic layer is made of a layered material of Co or Co-based alloy and a Ni-based alloy, said antiferromagnetic layer being made of Cr—Mn-based alloy or Cr—Mn-based alloy containing at least one selected from the group consisting of Co, Ni, Cu, Ag, Au, Pt, Pd, Rh, Ru, Ir, Os and Re in a total content of from 0.1 to 30 atomic %.

14. A magnetic storage/read system according to claim 11, wherein said ferromagnetic layer is made of a layered material having Co or Co-based alloy layer on each of both surfaces thereof and a Ni-based alloy layer sandwiched therebetween, said antiferromagnetic layer being made of Cr—Mn-based alloy or Cr—Mn-based alloy containing at least one selected from the group consisting of Co, Ni, Cu, Ag, Au, Pt, Pd, Rh, Ru, Ir, Os and Re in a total content of from 0.1 to 30 atomic %.

15. A magnetic storage/read system according to claim 10, wherein said magnetic sensor has an active area producing magnetoresistance and a bias layer adjacent to said active area and applying a bias field to said active area, and said bias layer has Cr—Mn-based alloy antiferromagnetic layer of which the basic structure is a base center cubic structure in direct intimate contact with Co or Co-based alloy.

16. A magnetic storage/read system according to claim 11, wherein said storage/read system is driven at an apparatus environment temperature of at least 100° C.

17. A magnetic storage/read system according to claim 11, wherein said magnetic sensor in which a unidirectional anisotropy produced in the layered structure of both said ferromagnetic layer and said antiferromagnetic layer has a substantially same direction as a magnetic field produced from current flowing through the magnetic sensor.

18. A layered material according to claim 1, wherein a magnetizing process is carried out, which process comprises the steps of heating at a temperature lower than the blocking temperature at which said unidirectional anisotropy disappears, and cooling while applying the magnetic field.

19. A magnetic storage/read system comprising a disk which has a ferromagnetic recording medium magnetically recording a signal and which has a magnetic head performing relative movement relative to said disk, which head has a surface sliding in the vicinity of said disk, so that a magnetic field leaking from said disk is detected, wherein said magnetic head has a thin film formed by sequentially laminating a soft magnetic layer, a non-magnetic layer, a ferromagnetic layer and an antiferromagnetic layer, and in which magnetization of said soft magnetic layer rotates in response to an external magnetic field, resulting in a change in a relative angle defined by both the rotated magnetization and that of said ferromagnetic layer, thus imparting magnetoresistance, and wherein said ferromagnetic layer is made of a layered material having a first ferromagnetic layer, a second ferromagnetic layer and a third ferromagnetic layer.

20. A magnetic storage/read system according to claim 19, wherein saturation flux density of said second ferromagnetic layer is smaller than saturation flux density of said first and third ferromagnetic layers.

21. A magnetic storage/read system according to claim 19, wherein said ferromagnetic layer has a thickness of at least 3 nanometers.

22. A magnetic storage/read system according to claim 21, wherein said ferromagnetic layer has a thickness within a range of from 3 nanometers to 20 nanometers.

23. A magnetic storage/read system according to claim 19, wherein said second ferromagnetic layer contains 50 to 85 atomic % nickel, 15 to 20 atomic % iron, and the balance one of up to 35 atomic % in total selected from the group consisting of chromium, vanadium, titanium, copper, gold, silver, platinum group elements, tantalum, niobium, zirconium and hafnium, and has a saturation flux density of up to 0.9 tesla.

24. A magnetic storage/read system according to claim 19, wherein at least one of said first and third ferromagnetic layers is made of magnetic material having a saturation flux density of at least 1.0 tesla and which magnetic material contains Co as a main component thereof.

25. A magnetic storage/read system according to claim 15, wherein said Cr—Mn-based alloy antiferromagnetic layer has a structure in which a crystal lattice of body center cubic structure or of CsCI-structure is strained within a range of from 0.1 to 10%.

26. A magnetic storage/read system according to claim 15, wherein a heat treatment for straining said Cr—Mn-based alloy antiferromagnetic layer is performed.

27. A magnetic sensor according to claim 2, wherein the Co alloy contains Co, Ni and Fe, the composition of the Co alloy consisting essentially, by atomic percent, of 30 to 98% Co, 0 to 30% Ni, and 2 to 50% Fe, and preferably consisting essentially, by atomic percent, of 85 to 95% Co and 5 to 15% Fe, or alternatively 50 to 70% Co, 10 to 30% Ni, and 5 to 20% Fe.

28. A magnetic storage/read system according to claim 12, wherein the Co alloy contains Co, Ni and Fe, the composition of the Co alloy consisting essentially, by atomic percent, of 30 to 98% Co, 0 to 30% Ni, and 2 to 50% Fe, and preferably consisting essentially, by atomic percent, of 85 to 95% Co and 5 to 15% Fe, or alternatively 50 to 70% Co, 10 to 30% Ni, and 5 to 20% Fe.

29. A magnetic storage/read system according to claim 12, wherein the Co alloy contains Co, Ni, Fe and additive element X, a total amount of Co, Ni and Fe being 70 to 98 atomic %, an amount of X being 2 to 30 atomic %, said X being at least one selected from the group consisting of Cu, Cr, V, Ti, Ta, Nb, Zr, Hf and platinum group elements.

30. A magnetic storage/read system according to claim 15, wherein an oxide layer is provided on a surface of the antiferromagnetic layer of the Cr—Mn-based alloys, which oxide layer is formed by a heat treatment, thin film-forming technique, or ion-implantation etc.

31. A magnetic head for detecting a magnetic field leaking from a ferromagnetic recording medium in which signals are magnetically recorded, said magnetic head being relatively movable in close vicinity to the recording medium, said magnetic head comprising a magnetic layered material having a ferromagnetic layer and an antiferromagnetic layer in intimate contact with the ferromagnetic layer, at least a part of the antiferromagnetic layer, by which antiferromagnetic layer uniaxial anisotropy is brought about in the ferromagnetic layer, being a Cr—Mn based alloy, at least a part of the ferromagnetic layer in intimate contact with the antiferromagnetic layer being Co or Co alloy.

* * * * *